(12) United States Patent
Jain

(10) Patent No.: US 11,682,434 B2
(45) Date of Patent: Jun. 20, 2023

(54) LOW POWER SCHEME FOR POWER DOWN IN INTEGRATED DUAL RAIL SRAMS

(71) Applicant: Taiwan Semiconductor Manufacturing Company, Ltd., Hsinchu (TW)

(72) Inventor: Sanjeev Kumar Jain, Ottawa (CA)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 17/549,962

(22) Filed: Dec. 14, 2021

(65) Prior Publication Data

US 2022/0319557 A1    Oct. 6, 2022

Related U.S. Application Data

(60) Provisional application No. 63/168,399, filed on Mar. 31, 2021.

(51) Int. Cl.
   *G11C 5/14* (2006.01)
   *G11C 11/417* (2006.01)

(52) U.S. Cl.
   CPC ............ *G11C 5/148* (2013.01); *G11C 11/417* (2013.01)

(58) Field of Classification Search
   CPC ...... G11C 5/148; G11C 11/417; G11C 11/418; G11C 5/147; G11C 7/14; G11C 7/225; G11C 8/08; G11C 5/144
   See application file for complete search history.

(56) References Cited

U.S. PATENT DOCUMENTS

| | | | | |
|---|---|---|---|---|
| 2004/0103328 A1* | 5/2004 | Ichien | ................ | G06F 1/3228 713/300 |
| 2007/0183251 A1* | 8/2007 | Jang | ................. | G11C 7/22 365/233.1 |
| 2008/0298142 A1* | 12/2008 | Chen | ................. | G11C 11/419 365/194 |
| 2012/0120702 A1* | 5/2012 | Browning | .......... | G11C 15/04 365/49.17 |
| 2013/0010544 A1* | 1/2013 | Lin | ................... | G11C 7/04 365/191 |
| 2022/0068327 A1* | 3/2022 | Jain | ................... | G11C 7/20 |

* cited by examiner

*Primary Examiner* — Khamdan N. Alrobaie
(74) *Attorney, Agent, or Firm* — Jones Day

(57) ABSTRACT

Systems and methods are provided for controlling power down of an integrated dual rail memory circuit. The power down system is configured to power down the power rail for input and logic components (VDD) while maintaining power to the power rail for the memory cells (VDDM). The power down system includes two voltage rails, a clock generator, and a power detector for detecting the power on VDD. The power detector generates an isolated power signal when voltage on VDD is below a voltage threshold. The isolated power signal is configured to disable the clock generator and thus reduce dynamic power as the read/write cycle is not triggered during power down.

20 Claims, 14 Drawing Sheets

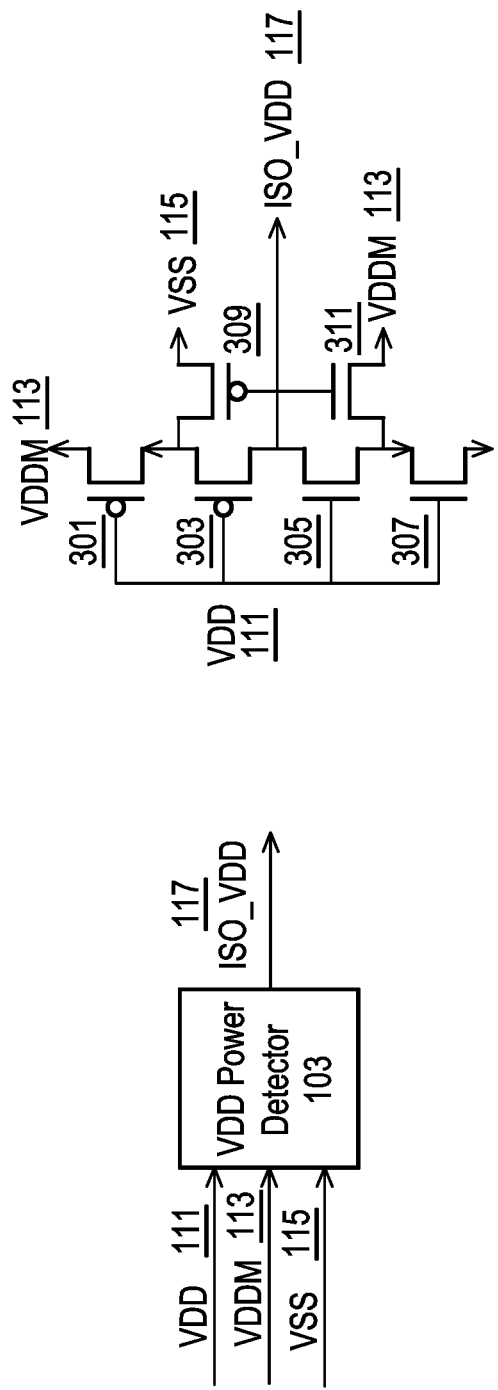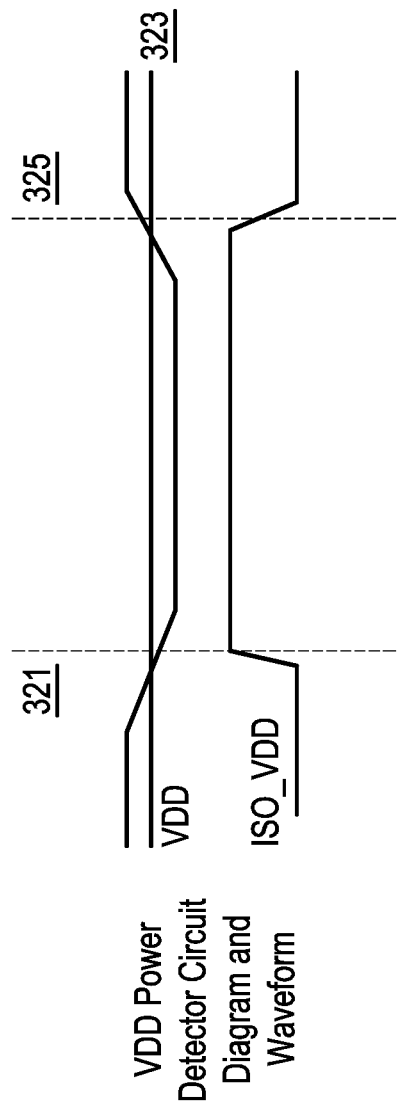
FIG. 3A
FIG. 3B
FIG. 3C
VDD Power Detector Circuit Diagram and Waveform

LOW POWER SCHEME FOR POWER DOWN IN INTEGRATED DUAL RAIL SRAMS

CROSS-REFERENCE TO RELATED APPLICATIONS

This application claims priority to U.S. Provisional Application No. 63/168,399, filed Mar. 31, 2021, entitled "Low Power Scheme for Power Down in Integrated Dual Rail SRAM" which is incorporated herein by reference in its entirety.

TECHNICAL FIELD

The technology described in this patent document relates generally to semiconductor memory systems, and more particularly to power management systems and methods for a semiconductor memory system.

BACKGROUND

Power gates are often used to turn off periphery and memory array in a low power memory. When memory comes out of a sleep mode (e.g., shut-down, deep sleep, and light sleep), large power gates may be used to ramp up the internal supply voltage of the memory.

Memory may take a variety of forms. For example, static random-access memory is a type of random-access memory that uses latching circuitry (flip-flop) to store each bit. SRAM is volatile memory so data is lost when power is removed. A memory bank is a logical unit of storage. A memory bank typically includes multiple rows and columns of storage units (memory cells). Control signal are routed to memory banks to initiate operations, such as read and write operations. Operating memory banks has an associated power cost as does transmission of control signals for operating those memory banks. These power costs include time periods during which a memory is being put into a low power state and brought out of a low power state.

BRIEF DESCRIPTION OF THE DRAWINGS

Aspects of the present disclosure are best understood from the following detailed description when read with the accompanying figures.

FIGS. 3A-3C are timing and logic layout diagrams depicting a power detector for a dual rail power system in memory (e.g. SRAM) in accordance with an embodiment.

DETAILED DESCRIPTION

Figure 1:
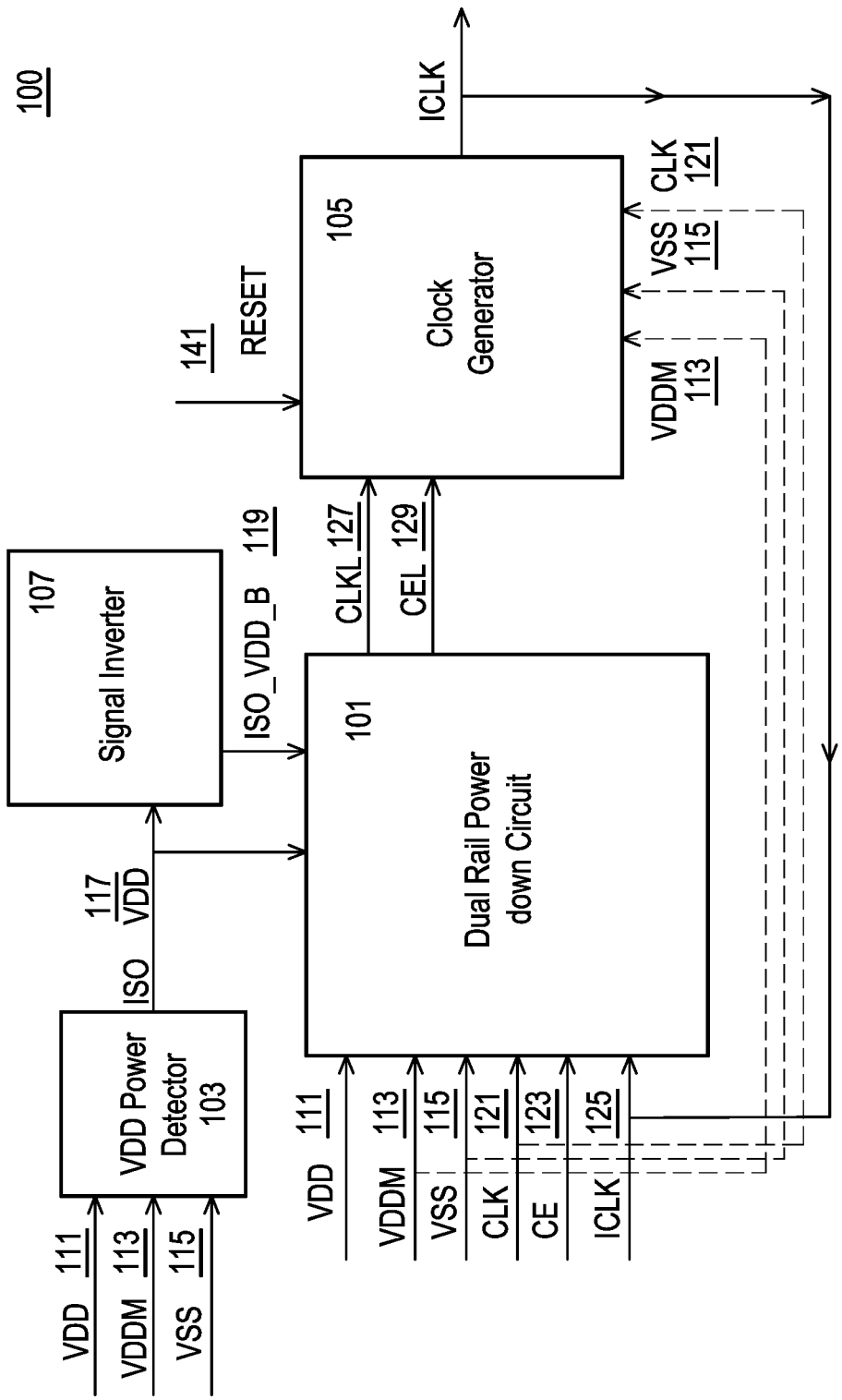
FIG. 1 is a block diagram depicting a power management circuit configured for power down of a dual rail power system in memory (e.g. SRAM) in accordance with an embodiment.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Dual rail SRAM devices utilize two separate positive voltage rails with separate domains within an SRAM device. One example dual rail architecture, an integrated dual rail (IDR) SRAM, utilizes level shifters on input pins to shift between the two positive voltage rails. Generally the dual rails are referred to as VDD (for logic and components) and VDDM (for memory cells). There is also a third negative voltage line VSS (voltage source source) which is generally ground.

Memories may experience performance issues when voltages are not at their optimum level. For example, transmission of VDD Signals driven by VDD powered gates may slow down at low VDD levels. A dual-rail architecture can improve SRAM low voltage operation in some embodiments. Performance with regard to low voltage issues may be improved by de-coupling power operations such that one voltage rail is used to power certain elements (drivers, periphery circuits, etc.) while the other rail powers other elements. Performance may be maintained in embodiments by maintaining enable signals in the domain of the other power rail (VDDM). In some examples, VDDM is used to power the SRAM array and VDD is used to power the rest of the circuitry logic.

Systems and methods for power management in a memory system are described herein. In embodiments, a power detector circuit is added to a dual rail power system for a semiconductor memory system (e.g., SRAM) to track the VDD power in order to provide an isolation signal for chip enable during power down. In this way, either rail of a dual rail architecture can be powered down first as the internal clock generated signal (ICLK) by the clock generator can be tied low during VDD power down, and consequentially, dynamic power and leakage current may be reduced in comparison to existing SRAM architectures.

Systems and methods for powering down memory systems are described for integrated dual rail (IDR) embodiments. Integrated dual rail systems utilize level shifters on certain inputs to shift the signal voltage between the voltage level of the two voltage rails, the voltage level of an associated voltage rail is referred to as a voltage domain. Dual rail systems thus have two voltage domains each associated with the voltage on the associated power rail. The system uses power to shift voltage from the lower power rail voltage to the voltage domain associated with the higher voltage rail. However, a level-down power shifter can be configured with general inverters or buffers powered by the lower supply voltage. Integrated dual rail generally have one voltage rail for the memory array (VDDM) and a separate voltage rail for the input pins and logic circuitry (VDD). Integrated dual rail may be utilized in certain designs to preserve power to certain components while powering down other components. For example, power may be preserved to memory cells to retain data in RAM memory while power to logic circuitry and inputs are powered down to preserve power.

Further IDR power down circuitry described herein reduces dynamic power costs of associated memory (e.g., SRAM) arrays. Specifically, the circuitry consumes less dynamic power during power down of VDD power rails while the VDDM power rail remains powered on. In these embodiments, chip enable is tied low so the internal clock (ICLK) signals are not enabled costing additional power by continuing to trigger read/write signals at the clock generator. Specifically the chip enable signal is tied low during VDD ramp down to prevent the clock generator from toggling additional internal clock signals through a chip enable NMOS transistor.

In other embodiments, a VDD power detector may be connected to the level shifter logic for all pins to reduce leakage current since NMOS transistors in the level shifters are no longer triggered due to floating point voltage on respective input and VDD connected inverters. The signal generated by the power detector ties outputs from the different level shifters to a logic low state so that voltage is no longer floating during VDD power down. In other embodiments the VDD power detector circuitry generates an isolated signal that is only connected to the chip enable level shifter for the clock generator and therefore the power down circuity has less area penalty (e.g., 0.5%).

FIG. 1 is a block diagram depicting a power management circuit configured for power down of a dual rail power system in memory (e.g. SRAM) in accordance with an embodiment. The example power management circuit 100 includes a dual rail power down circuit 101, a VDD power detector 103, a clock generator 105, and a signal inverter 107. In the illustrated embodiment, the dual rail power down circuit 101 receives inputs to a first voltage rail 111 (VDD), a second memory power rail 113 (VDDM), a negative voltage rail or ground 115 (VSS), a clock signal 121 (CLK), a chip enable signal 123 (CE), an isolated VDD power signal 117 (ISO_VDD), an isolated VDD power signal bar 119 (ISO_VDD_B), and an internal clock signal 125 (ICLK). The dual rail power down circuit 101 is configured to generate a clock latch signal 127 (CLKL) and a chip enable latch signal 129 (CEL). The VDD power detector 103 is connected to the first power rail 111 (VDD), the second memory power rail 113 (VDDM), and the negative voltage rail or ground 115 (VSS). The VDD power detector 103 generates the isolated VDD power signal 117 (ISO_VDD). In some embodiments described herein, the VDD power detector 103 is in the VDDM domain. The clock generator 105 is configured to receive the clock latch signal 127 (CLKL) and the chip enable latch signal 129 (CEL) from the dual rail power down circuit 101. The clock generator 105 also receives a reset signal 141 (RESET), the second memory power rail 113 (VDDM), a connection to ground 115 (VS S), and the clock signal 121 (CLK). The signal inverter 107 is configured to receive the isolated first rail power signal 117 (ISO_VDD) from the VDD power detector 103. The isolation signal inverter 107 inverts the isolated VDD power signal 117 (ISO_VDD) which is received by the dual rail power down circuit 101. The clock generator 105 generates a new internal clock signal 125 (ICLK) which is received by the dual rail power down circuit 101. Input signals, for example the clock 121 (CLK) signal and the chip enable signal 123 (CE), are generally in the VDD domain and thus have associated level shifters to shift to the VDDM domain.

Figure 2:
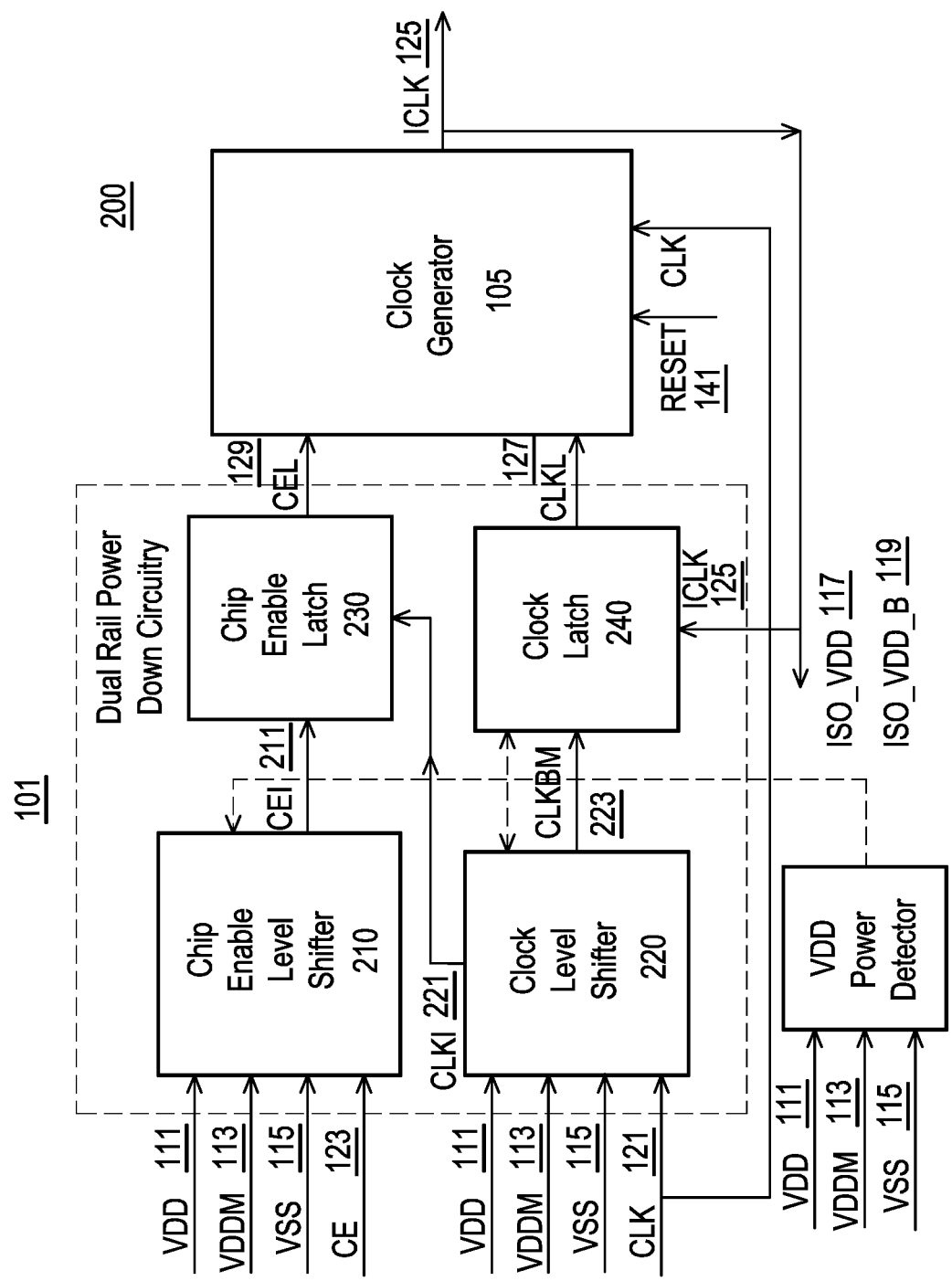
FIG. 2 is a block diagram depicting a power management circuit configured for power down of a dual rail power system in memory (e.g. SRAM) in accordance with an embodiment.

FIG. 2 is a block diagram depicting a power management circuit configured for power down of an IDR dual rail power system in memory (e.g. SRAM) in accordance with an embodiment. An example power management circuit 200 includes the dual rail power down circuitry 101, the VDD power detector 103, and the clock generator 105. The dual rail power down circuitry 101 includes a chip enable level shifter 210, a clock level shifter 220, a chip enable latch circuit 230, and a clock latch circuit 240. The chip enable level shifter 210 receives input from the first power rail 111 (VDD), the second memory power rail 113 (VDDM), a negative voltage rail or ground 115 (VSS), the chip enable signal 123 (CE), and the isolated first rail power signal 117 (ISO_VDD). The chip enable level shifter generates a chip enable input 121 (CEI) signal which is connected to the chip enable latch circuit 230. The clock level shifter 220 is configured to receive inputs from the first power rail 111 (VDD), the second memory power rail 113 (VDDM), the negative voltage rail or ground (VSS), and the clock signal 121 (CLK). The clock level shifter 220 generates a clock input signal 221 (CLKI) which is connected to the chip enable latch circuit 230. The clock level shifter 220 also generates a clock bar memory signal which is connected to the clock latch circuit 240.

The chip enable latch circuit 230 operates as a multiple transistor latch between a chip enable input signal 211 (CEI) and the clock input signal 221 (CLKI). The chip enable latch circuit 230 generates the chip enable latch signal 129 (CEL) which is connected to the clock generator 105. The chip enable input signal 211 (CEI) is connected between the chip enable level shifter 210 and the chip enable latch circuit 230. The clock input signal 221 (CLKI) is connected between the clock level shifter 220 and the chip enable latch circuit 230. The chip enable latch circuit 230 may include multiple transistors (e.g. PMOS and NMOS transistors). The chip enable latch circuit 230 may be designed such that the chip enable input signal 211 (CEI) is transferred through the latch when the clock input signal 221 (CLKI) is tied low. The chip enable level shifter 210 shifts the clock 121 (CLK) input signal from the VDD domain to an outputs clock bar VDDM and clock The clock latch circuit 240 operates as a multiple transistor latch between a clock bar VDDM 223 (CLKBM)

signal and the internal clock 125 (ICLK). The clock latch circuit 240 generates a clock latch signal 127 (CLKL) which is connected to the clock generator 105. The clock bar VDDM 223 (CLKBM) is connected between the clock level shifter 220 and the clock latch circuit 240. The internal clock signal 125 (ICLK) is connected between the clock generator 105 and the clock latch circuit 240. The clock latch circuit 240 may include multiple transistors (e.g. PMOS and NMOS transistors). The chip enable latch circuit 230 may be designed such that the clock bar VDDM signal 223 (CLKBM) is transferred through the latch when the internal clock signal 125 (ICLK) is tied low. The chip enable latch circuit may also include either an inverter or a NOR logic gate such that the clock bar VDDM 223 (CLKBM) is inverted or transferred through as the identical logic state as the clock latch signal 127 (CLKL).

The chip enable level shifter 210 receives the chip enable signal 123 (CE) and shifts the signal from the VDD domain to the VDDM domain utilizing a series of transistors and connections to the VDDM power rail 113. The chip enable level shifter 210 includes coupled transistors that output the chip enable input 211 (CEI) as logic high in the VDDM domain when the chip enable signal 123 (CE) is logic high in the VDD domain. An example chip enable level shifter 210 is described in more detail in FIG. 4A. Similarly, the clock level shifter shifts the clock signal from the VDD domain to the VDDM domain using a series of transistors and a connection to the VDDM power rail 113. The clock enable level shifter 220 includes coupled transistors that output the clock input signal 221 (CLKI) as logic high in the VDDM domain when the clock signal 121 (CE) is logic high in the VDD domain. An example chip enable level shifter 210 is described in more detail in FIG. 4A.

FIGS. 3A-3C are logic layout and timing diagrams depicting a power detector for a dual rail power system in memory (e.g. SRAM) in accordance with an embodiment. With reference to FIG. 3A, and as depicted in the embodiment in FIG. 1, the VDD power detector 103 may be connected to the first power rail 111 (VDD), the second memory power rail 113 (VDDM), and ground (VSS). The VDD power detector 103 is designed to generate an isolated VDD signal 117 (ISO_VDD) which may be connected to multiple input pins and level shifters to signal that the VDD power is ramped down. FIG. 3B is an example VDD power detector 103 circuit diagram which depicts how the isolated VDD signal 117 (ISO_VDD) is generated based on the threshold voltage at the gate of transistors within the VDD power detector 103. FIG. 3C is a timing diagram depicting the logic state of the isolated VDD signal 117 (ISO_VDD) based on the voltage level of the first power rail 111 (VDD).

With reference to FIG. 3B, the VDD power detector 103 may be designed to include multiple transistors (e.g. NMOS and PMOS transistors) in a configuration that connects the isolated VDD power signal 117 (ISO_VDD) either to the voltage on the second memory power rail 113 (VDDM) or to ground 115 (VSS) in an embodiment. For example, the example embodiment in FIG. 3B contains six transistors configured such that the isolated VDD power signal 117 (ISO_VDD) is connected to ground when a first PMOS transistor 301 and a second PMOS transistor 303 are in an off state and a first NMOS transistor 305 and a second NMOS transistor 307 are in an on state. The isolated VDD power signal 117 (ISO_VDD) is connected to the second memory voltage rail (VDDM) when the first and second PMOS transistors 301, 303 are in an on state such that current is flowing through the transistor and the first and second NMOS transistors 305, 307 are in an off state such that the isolated VDD power signal 117 (ISO_VDD) is floating relative to ground 115 (VSS).

The first PMOS transistor 301 and the second PMOS transistor 303 are configured such that VDD is connected to the gates of both transistors. The first PMOS transistor 301 is configured with the source connected to the second memory voltage rail 113 (VDDM) and the drain connected to the source of the second PMOS transistor 303. The second PMOS transistor 303 is configured with the source connected to the drain of the first PMOS transistor 301 and the drain connected to the isolated VDD power signal 117 (ISO_VDD). In this manner current flows from the second memory voltage rail 113 (VDDM) to the isolated VDD power signal (ISO_VDD) when VDD is low since the transistors are in an on state and the second memory voltage rail 113 (VDDM) operates as an open circuit when the first power rail VDD is in a high state since current does not flow through the PMOS transistors 301, 303.

The first NMOS transistor 305 and the second NMOS transistor 307 are configured such that VDD is connected to the gates of both transistors. The first NMOS transistor 305 is configured with the source connected to the drain of the second NMOS transistor 307 and the drain connected to the isolated VDD power signal 117 (ISO_VDD). The second NMOS transistor 305 is configured with the source connected ground 115 (VSS) and the drain connected to the source of the first NMOS transistor 305. In this manner the NMOS transistors 305, 307 operate as short circuits when VDD is above the threshold voltage for the gate and the NMOS transistors 305, 307 operate as an open circuit when VDD is below the threshold voltage for the gate.

Further in reference to FIG. 3B, the source of the second PMOS transistor 303 and the drain of the first PMOS transistor 301 are connected to the drain of an equalizer PMOS transistor 309. The source of the first NMOS transistor 305 and the drain of the second PMOS transistor 307 are connected to the drain of an equalizer NMOS transistor 311. The gate terminals of the equalizer transistors 309, 311 are coupled such that either the equalizer NMOS transistor 311 or the equalizer PMOS transistor 309 is operating in the on state. The gate terminals of the equalizer transistors 309, 311 are further connected to the isolated VDD power signal 117 (ISO_VDD) such that the equalizer PMOS transistor 309 is off when the isolated VDD power signal 117 (ISO_VDD) is in a logic high state and on when the isolated VDD power signal 117 (ISO_VDD) is in a logic low state. The NMOS equalizer transistor 311 is off when the isolated VDD power signal 117 (ISO_VDD) is in a logic low state and in an on state when the isolated VDD power signal 117 (ISO_VDD) is in a logic high state. In this manner the node between the two PMOS transistors is tied to ground 115 (VSS) when the isolated VDD power signal 117 (ISO_VDD) is in a logic low state, dissipating power which may be caused by the voltage differential between the first PMOS transistor 301 and the second PMOS transistor 303. The node between the two NMOS transistors 305, 307 is tied to the second memory voltage power rail 113 (VDDM) when the isolated VDD power signal 117 (ISO_VDD) is in a logic high state. This ensures that during power down of VDD the node is floating to prevent a connection from VDDM to ground by causing a matching voltage differential across the first NMOS transistor 305 and the second NMOS transistor 307 such that both NMOS transistors turn on at the same time. The cross-coupling ensures that a short does not develop during VDD ramp down or ramp up to prevent power losses which might occur if all transistors 301, 303, 305, 307 are operating at the same time.

With reference to FIG. 3C the VDD power detector 103 is designed to generate an isolated VDD power signal 117 (ISO_VDD) that transitions to a logic high state when the first power rail 111 (VDD) is below a voltage threshold 323 and transitions to a logic low state when the first power rail 111 (VDD) is above a voltage threshold 323. The timing diagrams as depicted in FIG. 3C show that during ramp down 321 of the first voltage rail 111 (VDD) the isolated VDD power signal 117 (ISO_VDD) will transition from a logic low state to a logic high state. Similarly, during ramp up 325 of the first voltage rail 111 (VDD) the isolated VDD power signal 117 (ISO_VDD) will transition from a logic high state to a logic low state. In this manner, the isolated VDD power signal 117 (ISO_VDD) indicates to connected circuitry whether the first power rail 111 (VDD) is above or below a designed threshold voltage. The isolated VDD power signal 117 (ISO_VDD) is in a logic high state when the voltage on the first power rail 111 (VDD) is below the threshold and in a logic low state when the voltage on the first power rail 111 (VDD) is above the threshold.

Figure 4A:
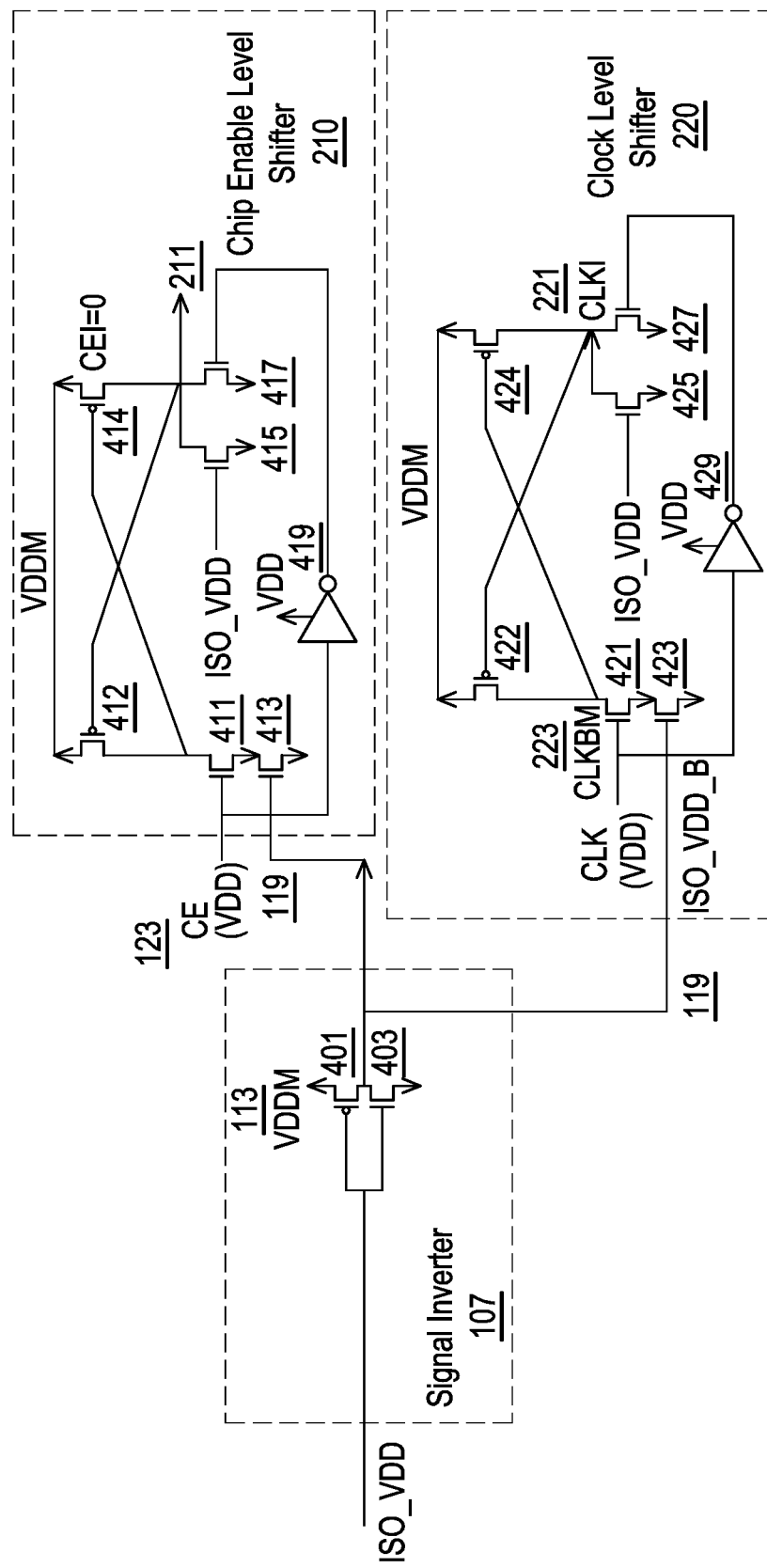
FIGS. 4A-4B are timing and logic diagrams depicting a power management circuit configured for power down of a dual rail power system in memory (e.g. SRAM) in accordance with an embodiment.
Figure 4B:
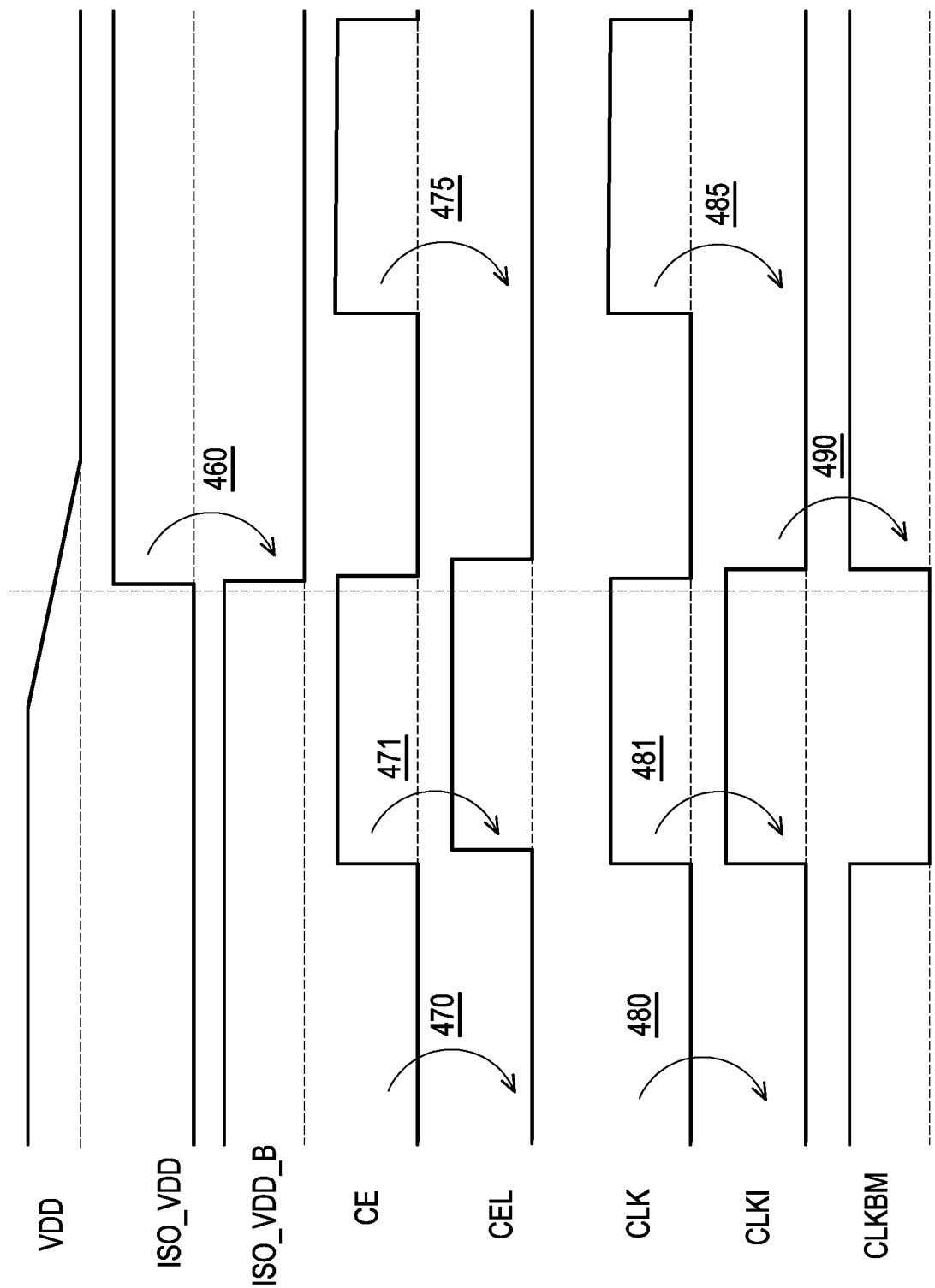

FIGS. 4A-4B are logic and timing diagrams depicting a power management circuit configured for power down of a dual rail power system in memory (e.g. SRAM) in accordance with an embodiment. FIG. 4A is a circuitry schematic depicting components within a dual rail power down circuit 101, specifically configured for power down of the clock and chip enable signals in accordance with an embodiment. FIG. 4B is a timing diagram depicting signal logic state transitions for the example dual rail power down circuitry FIG. 4A, specifically the power detection, level shifter, clock, and chip enable signals in accordance with an embodiment.

The power down circuitry 101 includes the signal inverter 107, the chip enable level shifter 210, and the clock level shifter 220. The signal inverter 107 is configured to invert the isolated VDD power signal 117 (ISO_VDD) to generate the isolated VDD power signal bar 119 (ISO_VDD_B). The signal inverter 107 includes a PMOS transistor 401 and an NMOS transistor 403. The PMOS transistor 401 is configured with the isolated VDD power signal 117 (ISO_VDD) connected at the gate the second memory power rail 113 (VDDM) at the drain and the isolated VDD power signal bar 119 (ISO_VDD_B) at the source. The NMOS transistor 403 is configured with the isolated VDD power signal 117 (ISO_VDD) connected at the gate, the isolated VDD power signal bar 119 (ISO_VDD_B) at the drain, and the source connected to ground 115 (VSS). In this configuration either the PMOS transistor 401 or the NMOS transistor 403 is on, such that current is flowing, and one is off, such that current is not flowing. The PMOS transistor 401 allows current to flow when the isolated VDD power signal 117 is low and operates as an open circuit when the VDD power signal 117 (ISO_VDD) is in a logic high state. The NMOS transistor 403 allows current to flow when the isolated VDD power signal 117 (ISO_VDD) is high and operates as an open circuit when the VDD power signal 117 (ISO_VDD) is in a logic low state. Thus the isolated VDD power signal bar 119 (ISO_VDD_B) is logic high when isolated VDD power signal is logic low 117 (ISO_VDD) and VDD power signal bar 119 (ISO_VDD_B) is logic low when isolated VDD power signal is logic high 117 (ISO_VDD) 460. The signal inverter 107 is powered by the second memory power rail 113 (VDDM) and thus the isolated VDD power signal bar 119 (ISO_VDD_B) is in the VDDM domain.

In this embodiment the chip enable level shifter 210 includes six transistors, a first NMOS transistor 411, a first PMOS transistor 412, a second NMOS transistor 413, a second PMOS transistor 414, a third NMOS transistor 415, and a fourth NMOS transistor 417.

The first NMOS transistor 411 is a chip enable NMOS transistor. The second NMOS transistor 413 is an isolated VDD power signal bar NMOS transistor for the chip enable level shifter 210. The third NMOS transistor 415 is a power down NMOS transistor for the chip enable level shifter 210. The fourth NMOS transistor 417 is chip enable input NMOS transistor. The first PMOS transistor 412 is a first VDDM PMOS transistor for the chip enable level shifter 210. The second PMOS transistor 414 is a second VDDM PMOS transistor of the chip enable level shifter 210.

In this embodiment the clock level shifter 220 includes six transistors, a first NMOS transistor 421, a first PMOS transistor 422, a second NMOS transistor 423, a second PMOS transistor 424, a third NMOS transistor 425, and a fourth NMOS transistor 427.

The first NMOS transistor 421 is a clock signal NMOS transistor. The first PMOS transistor 422 is a first VDDM PMOS transistor for the clock level shifter 220. The second NMOS transistor 423 is an isolated VDD power signal bar NMOS transistor for the clock level shifter 220. The second PMOS transistor 424 is a second VDDM PMOS transistor for the clock level shifter 220. The third NMOS transistor 425 is a power down NMOS transistor for the clock level shifter 220. The fourth NMOS transistor 427 is a power down NMOS transistor for the clock level shifter 220.

The chip enable level shifter 210 includes connections to the first power rail (VDD), the second memory power rail 113 (VDDM) the chip enable signal 123 (CE), the isolated VDD power signal 117 (ISO_VDD), the isolated VDD power signal bar 119 (ISO_VDD_B), and ground 115 (VSS). The first NMOS transistor 411 is configured in series with the second NMOS transistor 413 with the chip enable signal (CE) 123 connected at the gate, the drain connected to the gate of the second NMOS transistor 414, and the source connected to the drain of the second NMOS transistor 413. The second NMOS transistor 413 is connected with the isolated VDD power signal bar 119 (ISO_VDD_B) connected at the gate terminal, the drain terminal connect to the source of the first PMOS transistor 411, and the source connected to ground 115 (VSS). The first PMOS transistor 412 and the second PMOS transistor 414 are cross-coupled PMOS transistors which operate to pull the voltage of the input signal, the chip enable signal 123 (CE), to the voltage on the second memory power rail 113 (VDDM) in generating the chip enable input signal 211 (CEI). An inverter 419 for the chip enable level shifter is connected between the chip enable signal 123 (CE) and the gate of the fourth NMOS transistor 417 with the inverter 419 connected to the VDD domain. This inverter configuration causes the fourth NMOS transistor 417 to tie the chip enable input signal 211 (CEI) to a logic low state when the chip enable signal 123 (CE) is logic low 470. This is because the inverter 419 inverts the chip enable 123 signal (CE) to a logic high state on the gate of the fourth NMOS transistor 417 thus allowing current to flow through the fourth NMOS transistor 417 to ground 115 (VSS). In the same manner, the chip enable input signal 211 (CEI) signal may be in a logic high state when the chip enable 123 signal (CE) is high 471. In this manner the chip enable level shifter 210 transmits the chip enable signal 123 (CE) from the VDD domain to the chip enable input signal 211 (CEI) signal in the VDDM domain when VDD is above the voltage threshold 323 of the VDD power detector 103 and ties the output chip enable input signal 211 (CEI) signal to a logic low state when VDD is below the voltage threshold 475.

The isolated VDD power signal 117 (ISO_VDD) is connected to the gate of the third NMOS transistor 415 such that when the isolated VDD power signal 117 (ISO_VDD) is in a logic high state current is flowing through the transistor and when the isolated VDD power signal 117 (ISO_VDD) is in a logic low state the third NMOS transistor 415 operates as an open circuit. The third NMOS transistor 415 ties the chip enable input signal 211 (CEI) to ground when the isolated VDD power signal 117 (ISO_VDD) is logic high. The configuration further connects the chip enable input signal 211 (CEI) to the gate of the first VDDM PMOS transistor for the chip enable level shifter 212 such that the transistor allows current to flow when chip enable input signal 211 (CEI) is in a logic low state. Thus the isolated VDD power signal 117 (ISO_VDD) causes the chip enable input signal 211 (CEI) to be tied to a ground 115 (VSS) or logic low which further causes the first of the coupled VDDM PMOS transistors 412 to be in an operating state while the second PMOS transistor 414 in an off state, acting as an open circuit. Since the isolated VDD power signal 117 (ISO_VDD) ties the chip enable input signal 211 (CEI) to ground 115 (VSS), the chip enable input signal 211 (CEI) is at logic low when the voltage on the first power rail 111 (VDD) drops below the designed threshold voltage 475.

The clock level shifter 220 includes connections to the first power rail (VDD), the second memory power rail 113 (VDDM), the clock signal 121 (CLK), the isolated VDD power signal 117 (ISO_VDD), the isolated VDD power signal bar 119 (ISO_VDD_B), and ground 115 (VSS). The clock NMOS transistor 421 is configured in series with the second NMOS transistor 423 with the clock signal 121 (CLK) connected at the gate, the drain connected to the gate of the second PMOS transistor 424, and the source connected to the drain of the second NMOS transistor 423. The second NMOS transistor 423 is configured with the isolated VDD power signal bar 119 (ISO_VDD_B) connected at the gate terminal, the drain terminal connect to the source of the first NMOS transistor 421, and the source connected to ground 115 (VSS). The first PMOS transistor 422 and the second PMOS transistor 424 are cross-coupled PMOS transistors which operate to pull the voltage of the input signal, the clock signal 121 (CLK), to the voltage on the second memory power rail 113 (VDDM) in generating the clock input signal 221 (CLKI) signal. An inverter, the clock level shifter inverter 429, is connected between the clock signal 121 (CLK) and the gate of the fourth NMOS transistor 427 with the inverter connected to the VDD domain. This inverter configuration causes the fourth NMOS transistor 427 to tie the clock input signal 221 (CLKI) signal to a logic low state when the clock signal 121 (CLK) is logic low 480. This is because the clock level shifter inverter 429 inverts the logic low clock 121 (CLK) signal to a logic high state on the gate of fourth NMOS transistor 427 thus allowing current to flow through the fourth NMOS transistor 427 to ground 115 (VSS). In the same manner, the clock input signal 221 (CLKI) may be in a logic high state when the clock 121 (CLK) signal is high 481. In this manner the clock level shifter 220 transmits the clock 121 (CLK) signal from the VDD domain to the clock input signal 221 (CLKI) signal in the VDDM domain when VDD is above the voltage threshold 480, 481 and ties the clock input signal 221 (CLKI) signal to a logic low state when VDD is below the voltage threshold 485. Further the clock bar VDDM 223 (CLKBM) is the voltage at the drain of the first NMOS transistor 421 which is also connected to the gate terminal of the second PMOS transistor 424. The clock bar VDDM 223 (CLKBM) signal is the inverse of the clock input signal 221 (CLKI) 490.

The isolated VDD power signal 117 (ISO_VDD) is connected to the gate of the third NMOS transistor 425 such that when the isolated VDD power signal 117 (ISO_VDD) is in a logic high state current is flowing through the transistor and when the isolated VDD power signal 117 (ISO_VDD) is in a logic low state the third NMOS transistor 425 operates as an open circuit. The third NMOS transistor 425 ties the clock input signal 221 (CLKI) to ground when the isolated VDD power signal 117 (ISO_VDD) is logic high. The configuration further connects the clock input signal 221 (CLKI) to the gate of the first VDDM PMOS transistor for the clock level shifter 222 such that the transistor allows current to flow when clock input signal 221 (CLKI) is in a logic low state. Thus the isolated VDD power signal 117 (ISO_VDD) causes the clock input signal 221 (CLKI) to be tied to a ground 115 (VSS) or logic low which further causes the first of PMOS transistor 422 to be in an operating state while the second PMOS transistor 424 in an off state, acting as an open circuit. Since the isolated VDD power signal 117 (ISO_VDD) thus ties the clock input signal 221 (CLKI) to ground 115 (VSS), the clock input signal 221 (CLKI) is at logic low when the voltage on the first power rail 111 (VDD) drops below the designed threshold voltage 485.

The cross-coupled transistor configuration ensures that either the first PMOS transistor 412 or the second PMOS transistor 414 are operating in a on state, such that current is flowing from drain to source, and the other is operating in an off state such that a current is not flowing. The chip enable input signal 211 (CEI) is tied to a logic low state when VDD drops below the voltage threshold 323 or when chip enable 123 (CE) is logic low. This is because either the third NMOS transistor 415 or fourth NMOS transistor 417 will be in an on state and ties the chip enable input (CEI) signal 211 to a logic low state. The chip enable input is tied to VDDM when the second PMOS transistor 414 is turned on which occurs when both the first NMOS transistor 411 and the isolated VDD power signal bar NMOS transistor for the chip enable level shifter are turned on. These transistors are turned on when the isolated VDD bar 119 (ISO_VDD_B) is high and chip enable 123 (CE) is high such that the gate of the second PMOS transistor 414 is tied to ground 115 (VSS).

The cross-coupled transistor configuration ensures that either the first PMOS transistor 422 or the second PMOS transistor 424 are operating in a on state, such that current is flowing from drain to source, and the other is operating in an off state such that a current is not flowing. This further means that either the clock bar VDDM 223 (CLKBM) or clock input signal 221 (CLKI) are in a logic high state while the other is in a logic low state. When VDD 111 is above the voltage threshold the isolated VDD power signal 117 (ISO_VDD) is logic low, the isolated VDD power signal bar 119 (ISO_VDD_B) is high, the second NMOS transistor 423 is turned on, and the third NMOS transistor 425 is turned off. If the clock signal is logic high, the first NMOS transistor 421 is turned on and the third NMOS transistor 425 and the fourth NMOS transistor 427 are turned off. In this manner the transistor stack of the second NMOS transistor 423 and the third NMOS transistor 425 will tie the clock bar VDDM to ground 115 (VSS) and the third NMOS transistor 425 and the fourth NMOS transistor 427 will operate as an open circuit. Thus while VDD is above the voltage threshold 323 and clock is high, the clock input signal 221 (CLKI) is logic high and the clock bar VDDM is logic low. In all other combinations of the clock signal and the isolated VDD power signal 117 (ISO_VDD) the clock input signal 221 (CLKI) is logic low and clock bar VDDM 223 (CLKBM) is logic high. In situations where the clock input signal 221 (CLKI) is tied low, the first PMOS transistor 422 is turned on and the clock bar VDDM 223 (CLKBM) is tied to VDDM 113. In situations where the clock bar VDDM 223 (CLKBM) signal is tied low, the second PMOS transistor 424 is turned on and the clock input signal 221 (CLKI) is tied to VDDM 113.

Figure 5A:
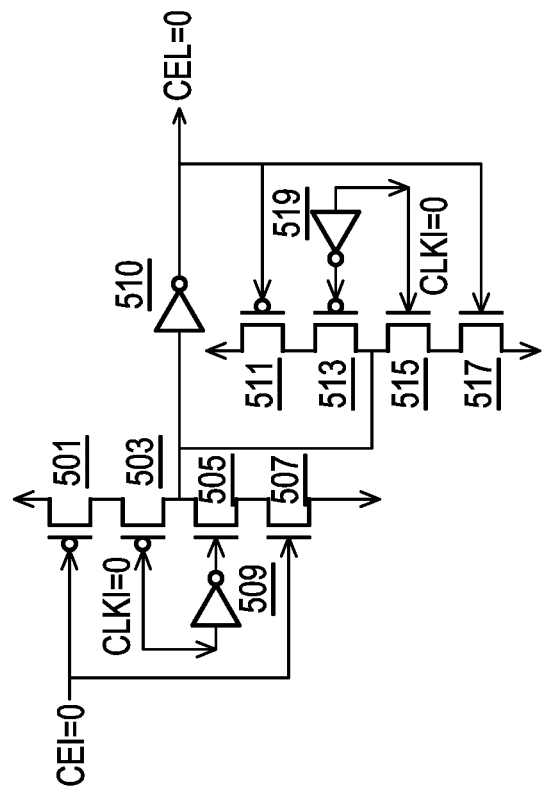
FIGS. 5A-B are timing and logic diagram depicting a latch configured for power down of a dual rail power system in memory (e.g. SRAM) in accordance with an embodiment.
Figure 5B:

FIGS. 5A-B are circuit and timing diagrams depicting a latch configured for power down of a dual rail power system in memory (e.g. SRAM) in accordance with an embodiment. FIG. 5A is an example embodiment of the chip enable latch circuit 230 as depicted in the block diagram in FIG. 2. FIG. 5B is a timing diagram depicting signal logic state transitions for the example latch configuration in FIG. 5A.

The example chip enable latch 230 embodiment includes eight transistors: a first NMOS transistor 501, a first PMOS transistor 503, a second NMOS transistor 505, a second PMOS transistor 507, a third NMOS transistor 511, a third PMOS transistor 513, a fourth NMOS transistor 515, and fourth PMOS transistor 517. The chip enable latch circuit 230, further includes a first inverter 509, a second inverter 519, and a third inverter 510. The first inverter 509 and the second inverter 519 invert the clock input signal 221 (CLKI) signal prior to the signal being received by the gate of the second NMOS transistor 505 and the third PMOS transistor 513.

The first NMOS transistor 501 is a first chip enable input NMOS transistor for the chip enable latch 230. The first PMOS transistor 503 is a first clock input PMOS transistor for the chip enable latch 230. The second NMOS transistor 505 is a first clock input NMOS transistor for the chip enable latch 230. The second PMOS transistor 507 is a first chip enable input PMOS transistor for the chip enable latch 230. The third NMOS transistor 511 is a second chip enable input NMOS transistor for the chip enable latch 230. The third PMOS transistor 513 is a second clock input PMOS transistor for the chip enable latch 230. The fourth NMOS transistor 515 is a second clock input NMOS transistor for the chip enable latch 230. The fourth PMOS transistor 517 is a second chip enable input PMOS transistor for the chip enable latch 230. The first inverter 509 is a chip enable latch 230 clock input signal 221 (CLKI) inverter. The second inverter 519 is a chip enable latch 230 clock input signal 221 (CLKI) inverter. The third inverter 510 is a the chip enable latch 230 internal signal inverter.

With reference again to FIGS. 4A-4B, the chip enable input signal 211 (CEI) and the clock input signal 221 (CLKI) are both tied to ground 115 (VSS) during power down of the first voltage rail 111 (VDD). Specifically, when the voltage on the first power rail 111 (VDD) is below the designed threshold voltage and the isolated VDD power signal 117 (ISO_VDD) is received by the chip enable level shifter 210 and clock level shifter 220. Due to the clock input signal 221 (CLKI) being in the logic low state, the current is permitted to flow through the first PMOS transistor 503 and the second NMOS transistor 505. When the clock input signal 221 (CLKI) is in a logic low state, current does not flow through the third PMOS transistor 513, and the fourth NMOS transistor 515 because the clock input signal 221 (CLKI) is logic low on the gate terminal NMOS transistor 515 and the inverted signal is logic high on the gate terminal of the PMOS transistor 513. The VDDM signal voltage is held on the input side of the inverter 510 as current flows through the first NMOS transistor 501 and the first PMOS transistor 503. This logic high is inverted by the third inverter 510 and results in chip enable logic matching the chip enable input signal as logic low 570. Similarly, when chip enable input signal 211 (CEI) is logic high the input to the inverter is tied to ground through the second NMOS transistor 505 and the second PMOS transistor 507 such that the chip enable latch signal 129 (CEL) signal matches the chip enable input signal 211 (CEI) signal as logic high 550. The third PMOS transistor 513 and the fourth NMOS transistor 515 are disabled when clock input 221 (CLKI) is tied low, thus the NMOS transistor 511 and the fourth PMOS transistor 517 operating state does not affect the logic state of the chip enable latch signal 129 (CEL).

If the clock input signal 221 (CLKI) is logic high the third PMOS transistor 513 and the fourth NMOS transistor 515 are transmitting while the first PMOS transistor 503 and the second NMOS transistor 505 are turned off. Thus if chip enable latch signal 129 (CEL) was in a logic low state when clock input signal 221 (CLKI) goes to a logic high state the chip enable latch signal 129 (CEL) will be held at a logic low state 580. This is because the third NMOS transistor 511 is on while the third PMOS transistor 513 begins transmitting, tying the input to the inverter high at VDDM. Further, the chip enable latch remaining at a logic low state will keep the fourth PMOS transistor 517 turned off. If the chip enable latch signal 129 (CEL) was in a logic high state when clock input signal 221 (CLKI) goes to a logic high state the chip enable latch signal 129 (CEL) will be held at a logic high state 560. This is because fourth PMOS transistor 517 is on while the fourth NMOS transistor 515 is transmitting, tying the input to the third inverter 510 low at VSS 115. Further, the chip enable latch signal 129 (CEL) remaining at a logic high state will keep the third NMOS transistor 511 turned off. In this manner the chip enable latch signal 129 (CEL) is held when clock input signal 221 (CLKI) goes high. The chip enable input signal 211 (CEI) is not transmitting since the first NMOS transistor 501 and the first PMOS transistor 503 are disabled and thus the chip enable latch signal 129 (CEL) is held if the chip enable input signal 211 (CEI) is toggled 590.

Figure 6A:
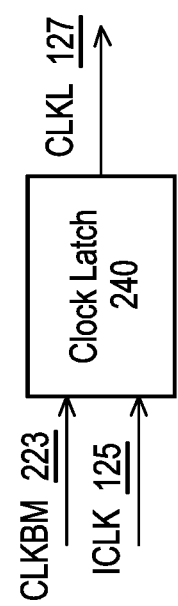
FIGS. 6A-B are timing and logic diagrams depicting a latch configured for power down of a dual rail power system in memory (e.g. SRAM) in accordance with an embodiment.
Figure 6A:
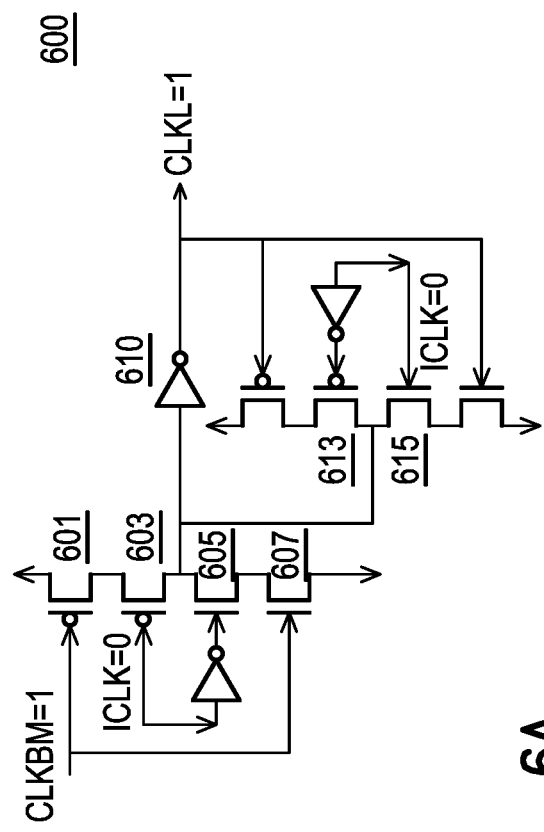
Figure 6B:
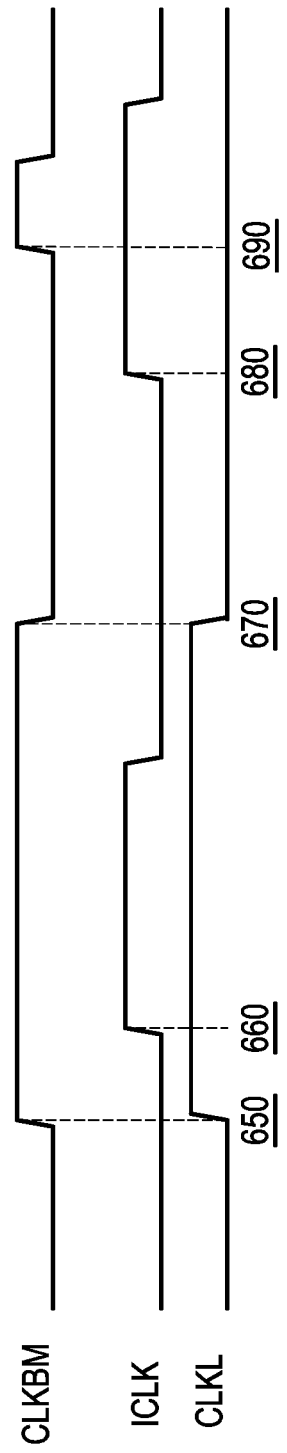

FIGS. 6A-B are circuit and timing diagrams depicting a latch configured for power down of a dual rail power system in memory (e.g. SRAM) in accordance with an embodiment. FIG. 6A is an example latch circuit diagram and FIG. 6B is the timing diagram associated with the example latch circuit diagram 600 in FIG. 6B. The example latch 600 is shown in FIG. 6A is the same as the example latch 500 shown in FIG. 5A, except that the example 600 shown in FIG. 6A receives inputs from the clock bar VDDM 223 (CLKBM) and the internal clock 125 (ICLK) instead of the chip enable input signal 211 (CEI) and the clock input signal 221 (CLKI) signals respectively. Further the output of the clock latch circuit 600 is the clock latch signal 127 (CLKL) instead of the chip enable latch signal 129 (CEL). FIG. 6A is an example embodiment of the clock latch circuit 240 as depicted in the block diagram in FIG. 2. Identical to the chip enable latch 500 shown in FIG. 5A, the example latch 600 will transmit the logic state of the input clock bar VDDM 223 (CLKBM) signal as the output clock latch signal 127 (CLKL) when the internal clock 125 (ICLK) signal is in a logic low state 650, 670. The input clock bar VDDM 223 (CLKBM) signal is not transmitted when the internal clock 125 (ICLK) signal is logic high 660, instead the clock latch signal 127 (CLKL) is held at its logic state when the internal clock 125 (ICLK) signal transitioned from a logic low state to a logic high state. Thus when the internal clock signal 125 (ICLK) is low and the clock bar VDDM 223 (CLKBM) is high, the clock latch signal 127 (CLKL) is also in a logic high state 650, at VDDM 113. Similarly when the internal clock signal 125 (ICLK) is low and the clock bar VDDM 223 (CLKBM) is low, the clock latch signal 127 (CLKL) is also in a logic low state 670, at VSS 115. Finally the clock latch signal 127 (CLKL) will be held at its current logic state when the internal clock 125 (ICLK) toggles to a logic high state 680, as the clock bar VDDM 223 (CLKBM) input is not transmitting 690.

The clock bar VDDM 223 (CLKBM) is tied to a logic high state during power down of the first power rail 111 (VDD). Thus, the current is not permitted to flow through a first clock bar memory PMOS transistor 601, but does flow through a first clock bar memory NMOS transistor 607. Further the internal clock signal 125 (ICLK) is tied to a logic low state during power down of the first power rail 111 (VDD). Thus, the current is permitted to flow through a first internal clock PMOS transistor 603 and a first internal clock NMOS transistor 605. In this manner, the input of a clock latch signal inverter 610 is tied to ground through the first internal clock NMOS transistor 605 and the first clock bar memory NMOS transistor 607 during power down of the first power rail 111 (VDD). The clock latch signal inverter 610 thus inverts the ground input of logic low and ties the clock latch signal 127 (CLKL) to a logic high state during power down of the first power rail 111 (VDD). The set clock input PMOS transistor 613 and the set clock input NMOS transistor 615 transistors are disabled when the internal clock 125 (ICLK) is tied to ground 115 (VSS).

In this embodiment the clock latch signal 127 (CLKL) is tied to a logic high state during power down of the first voltage rail 111 (VDD). A scheme that ties the clock latch signal 241 (CLKL) to a logic high state may be utilized to prevent the clock generator 105 from being toggled on or off based on the logic state of the chip enable latch signal 129 (CEL). Therefore, there is reduced risk of additional dynamic power usage as a floating voltage on the chip enable signal would not turn on the clock generator 105. Therefore less power would be utilized on read/write cycles.

Figure 7A:
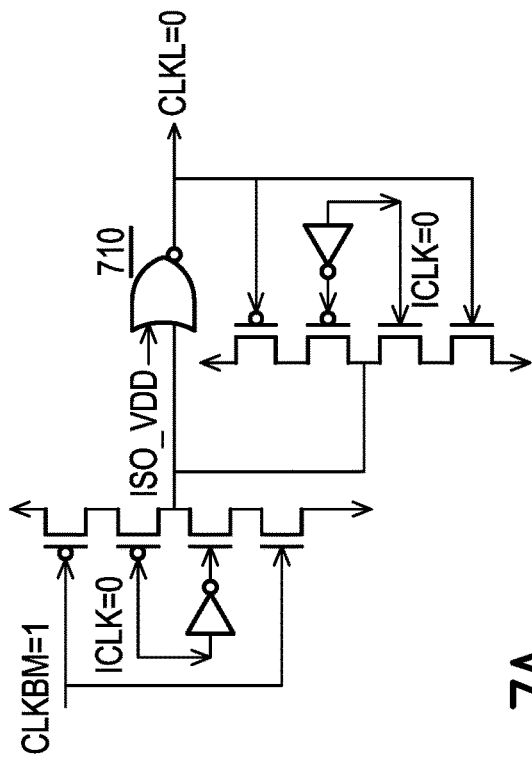
FIGS. 7A-B are additional timing and logic diagrams depicting a latch configured for power down of a dual rail power system in memory (e.g. SRAM) in accordance with an embodiment.
Figure 7B:
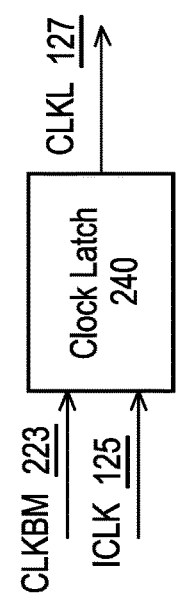

FIGS. 7A-B are additional circuit and timing diagrams depicting a latch configured for power down of a dual rail power system in memory (e.g. SRAM) in accordance with an embodiment. The example latch 700 shown in FIG. 7A is the same as the example latch 600 shown in FIG. 6A, except that the example 700 shown in FIG. 7A incorporates a NOR logic gate 710 instead of the clock latch signal inverter 610. The NOR logic gate 710 receives the internal input signal of the latch circuit and the isolated VDD power signal 117 (ISO_VDD). The output of the NOR logic gate is the clock latch signal 127 (CLKL). FIG. 7B is an example timing diagram for the latch configuration 700 in FIG. 7A.

Figure 5B:
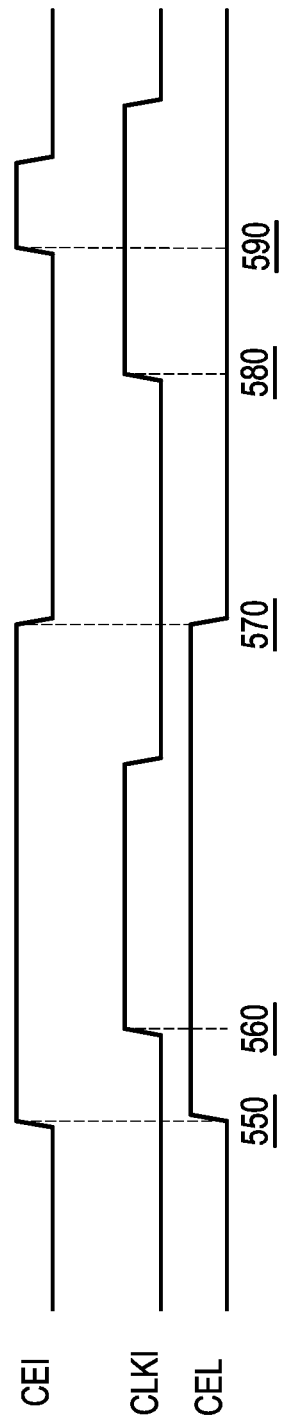

As depicted in FIG. 7B the output of a NOR gate is logic low unless both of the inputs are logic low. During power down of the first power rail 111 (VDD) the isolated VDD power signal 117 (ISO_VDD) is logic high, thus the output of the NOR gate, the clock latch signal 127 (CLKL), will be tied to a logic low state 720 during power down of the first voltage rail 111 (VDD). If the first voltage rail 111 (VDD) is above the threshold voltage than the isolated VDD power 117 (ISO_VDD) signal will be logic low and the NOR logic gate 710 will operate as an inverter, identical to the inverters 510, 610 in FIGS. 5, 6. Similar to FIGS. 6A-B, if the clock latch signal 127 (CLKL) is low when the internal clock 125 (ICLK) transitions to a logic high state the clock latch signal 127 (CLKL) will be set at the current low state 730 until the internal clock 125 (ICLK) signal transitions back to a logic low state.

In this embodiment the clock latch signal 127 (CLKL) is tied to a logic low state during power down of the first voltage rail 111 (VDD). A scheme that ties the clock latch signal 127 (CLKL) to a logic low state may be utilized to prevent the clock generator 105 from being able to be toggled on or off based on the logic state of the chip enable latch signal 129 (CEL). This embodiment may be utilized in certain designs to allow for reduced risk that a float in the chip enable latch signal 129 (CEL) would prevent startup of the clock generator 105.

Figure 8:
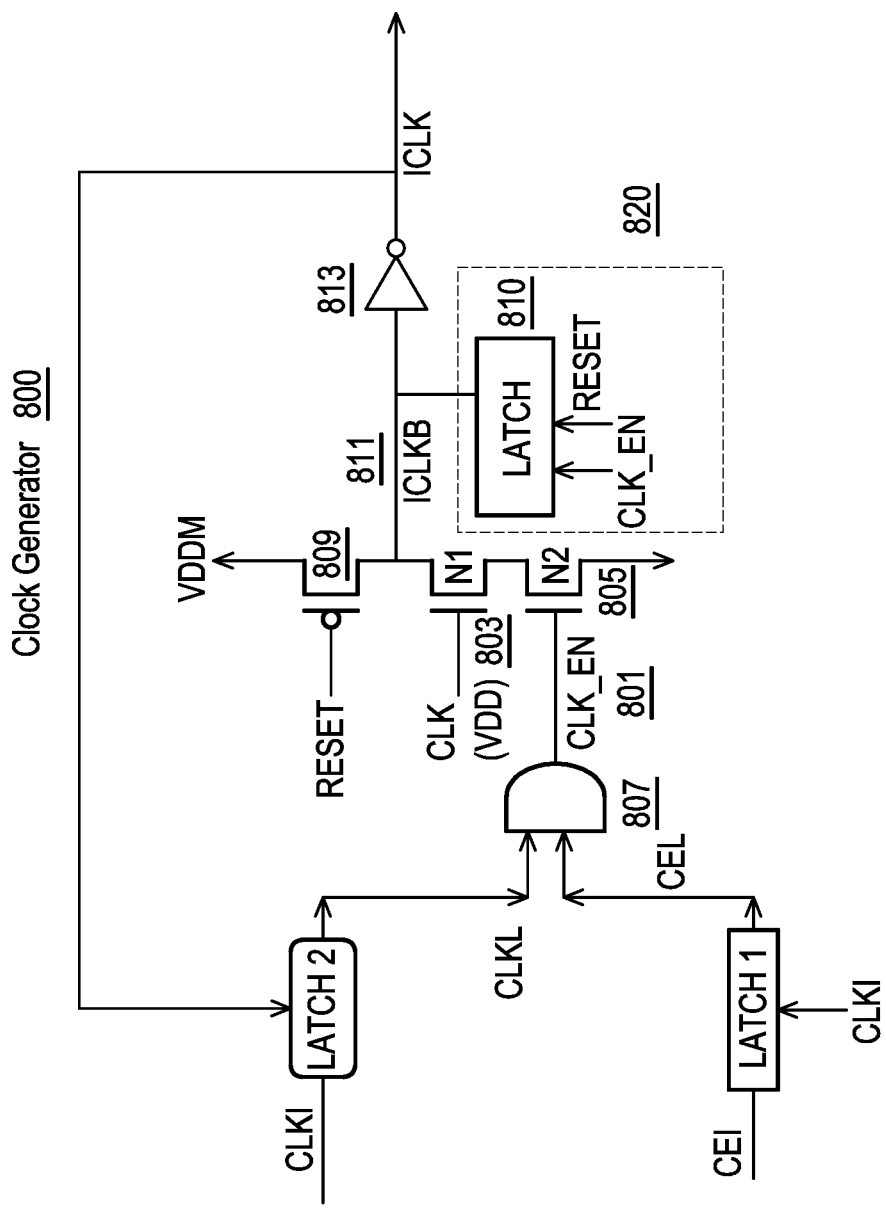
FIG. 8 is a diagram depicting a clock generator configured for power down of a dual rail power system in memory (e.g. SRAM) in accordance with an embodiment.

FIG. 8 is a diagram depicting a clock generator 800 configured for power down of a dual rail power system in memory (e.g. SRAM) in accordance with an embodiment. The clock generator 800 in FIG. 8 may be an example embodiment of the example clock generator 105 in FIG. 1. The clock generator 800 has connections to the clock latch signal 127 (CLKL), the chip enable latch signal 129 (CEL), the reset signal 141 (RESET), the clock signal 121 (CLK), the second memory power rail 113 (VDDM), and ground 115 (VSS). The clock generator 800 further includes a first NMOS transistor 803 (N1), a second NMOS transistor 805 (N2), a reset PMOS transistor 809, a reset latch 810 (LATCH), a logic (AND) gate for the latch inputs 807, a clock enable signal 801 (CLK_EN), an internal clock bar signal 811 (ICLKB), and a clock generator inverter 813. The logic (AND) gate for the latch inputs 807 is connected to receive the clock latch 127 (CLKL) signal and the chip enable latch 129 (CEL) signal. The logic (AND) gate for the latch inputs 807 generates the clock enable signal 801 (CLK_EN). The clock enable 801 (CLK_EN) signal is connected to the gate terminal of the second NMOS transistor 805 (N2) and the clock generator latch 810 (LATCH).

The first NMOS transistor 803 (N1) and the second NMOS transistor 805 (N2) are configured in series such that the internal clock bar 811 (ICLKB) is connected to ground when both of the NMOS transistors 803, 805 (N1 and N2) are operating in an on state. The first NMOS transistor 803 (N1) receives the clock 121 (CLK) signal from at the gate terminal and is configured with the internal clock bar 811 (ICLKB) at the drain and the drain of the second NMOS transistor 805 (N2) connected to the source. The clock signal is generally in the VDD voltage domain. The second NMOS transistor is configured with the clock enable signal 801 (CLK_EN) connected to the gate terminal, the source of the first NMOS transistor 803 (N1) connected to the drain and the source connected to ground 115 (VSS).

The clock generator 800 generates an internal clock signal 125 (ICLK) when both of the NMOS transistors 803, 805 (N1 and N2) are in an on state. Generally in an operating state the second NMOS transistor 805 (N2) is tied on and the clock 121 (CLK) toggled between a logic high and logic low state causing the first NMOS transistor 803 (N1) to toggle between an on state and an off state. The internal clock bar 811 (ICLKB) is low when both of the NMOS transistors 803, 805 (N1 and N2) are in an on state because the internal clock bar is connected to ground 115 (VSS). The internal clock bar 811 (ICLKB) is logic high when either of the NMOS transistors are off such that current is not flowing through the transistors. The internal clock bar 811 (ICLKB) is connected to the internal clock signal 125 (ICLK) through the clock generator inverter 813. Thus, the internal clock 125 (ICLK) is tied low when either of the NMOS transistors 803, 805 (N1 or N2) is disabled such as when the second NMOS transistor 805 (N2) is disabled during VDD power down.

The reset PMOS transistor 809 is configured with the reset signal 141 (RESET) connected to the gate terminal, the second memory power rail 113 (VDDM) connected to the drain, and the internal clock bar 811 (ICLKB) connected to the source. In this configuration the reset signal can toggle the reset PMOS transistor 809 or hold the clock generator 800 in a reset state during startup while the cycle rate ramps up. Further the clock generator 800 includes a clock synchronization system 820 which includes the clock generator latch 810 (LATCH) with the clock enable signal 801 (CLK_EN) and the reset 141 (RESET) signal. The clock generator latch 810 (LATCH) holds either the clock enable 801 (CLK_EN) or the reset 141 (RESET) signal such that the internal clock bar 811 (ICLKB) can be synchronized with the reset.

In the example embodiment, the clock generator 800 is configured such that the clock enable 801 (CLK_EN) is tied to a logic low state when the first power rail 111 (VDD) is powered down. The clock enable 801 (CLK_EN) is tied to a logic low state because the chip enable latch signal 129 (CEL) is tied low and the output of the logic AND gate for the latch outputs will always output a logic low signal when an input is low. The second NMOS transistor 805 (N2) is disabled when the clock enable 801 (CLK_EN) is tied to a logic low state. Thus the internal clock bar is tied to a logic high state tying the internal clock bar 811 (ICLKB) to a logic low state regardless of whether the first NMOS transistor 803 (N1) is enabled. Generally, the clock generator latch 810 (LATCH) and the reset PMOS transistor 809 are not triggered during VDD power down nor during general clock generator 800 operation. The reset transistor and clock generator latch 810 (LATCH) are generally triggered during clock generator 800 startup such as VDD ramp up 325. The clock generator 800 signals are located in the VDDM domain (the internal clock bar 811 (ICLKB), the internal clock 125 (ICLK), and the clock enable 801 (CLK_EN)). The clock generator 800 configuration forces the internal clock 125 (ICLK) to a logic low state during VDD power down 321 and thus reduces dynamic power which would be consumed by continued read/write signals if the chip enable inputs 129, 211, 221 (e.g., CEL, CEI, CLKI) to the second NMOS transistor 805 (N2) were floating and kept transistors in an operating state.

Figure 9:
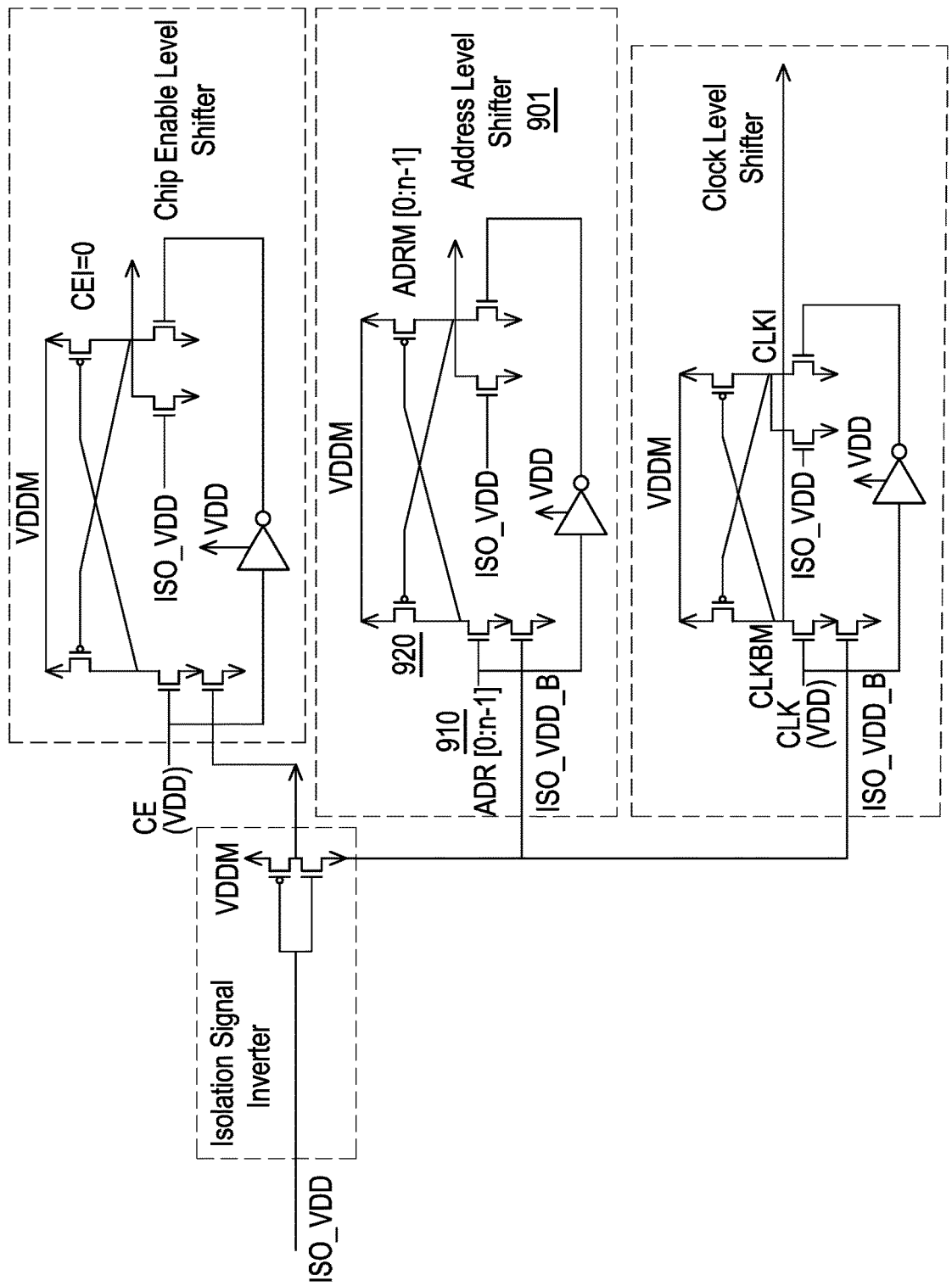
FIG. 9 is a diagram depicting a power management circuit configured for power down of a dual rail power system in memory (e.g. SRAM) with an address level shifter in accordance with an embodiment.

FIG. 9 is a diagram depicting a power management circuit configured for power down of a dual rail power system in memory (e.g. SRAM) with an address level shifter in accordance with an embodiment. The example circuitry 900 shown in FIG. 9 is the same as the example circuitry 400 shown in FIG. 4A, except that the example 900 shown in FIG. 9 includes an additional address level shifter 901. The address level shifter 901 may be included along with the clock level shifter 220, the chip enable level shifter 210, a write enable level shifter 1001, and a data line level shifter 1101. The address level shifter 901 is identical to the chip enable level shifter 210 except that it receives an address signal 910 (ADR [0:n−1]) and outputs an address signal VDDM 920 (ADRM [0:n−1]). Similar to the chip enable level shifter 210, the address level shifter 901 transmits the address signal 910 (ADR [0:n−1]) from the VDD domain to the output address VDDM signal 920 (ADRM [0:n−1]) in the VDDM domain. Further, the address level shifter 901 ties the address signal VDDM 920 (ADRM [0:n−1]) to a logic low state when the VDD voltage is ramped down below the designed voltage threshold 323. In particular, the address level shifter 901 ties the address signal VDDM 920 (ADRM [0:n−1]) to a logic low state when it receives the isolated VDD power signal 117 (ISO_VDD).

Figure 10:
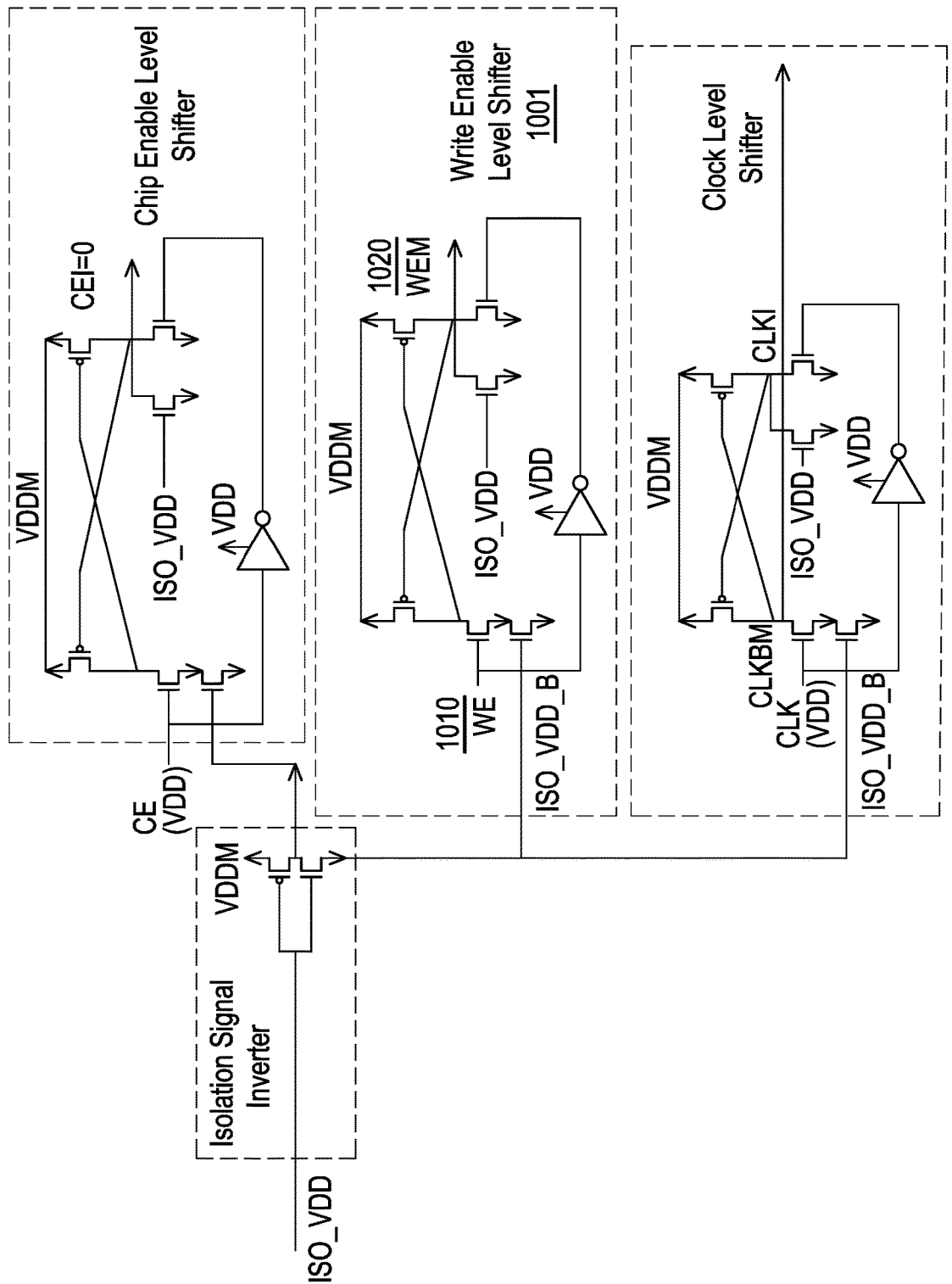
FIG. 10 is a diagram depicting a power management circuit configured for power down of a dual rail power system in memory (e.g. SRAM) with a write enable level shifter in accordance with an embodiment.

FIG. 10 is a diagram depicting a power management circuit configured for power down of a dual rail power system in memory (e.g. SRAM) with a write enable level shifter in accordance with an embodiment. The example circuitry 1000 shown in FIG. 10 is the same as the example circuitry 400 shown in FIG. 4A, except that the example 1000 shown in FIG. 10 includes an additional write enable level shifter 1001. The write enable level shifter 1001 may be included along with the clock level shifter 220, the chip enable level shifter 210, the address level shifter 901, and a data line level shifter 1101. The write enable level shifter 1001 is identical to the chip enable level shifter 210 except that it receives a write enable 1010 (WE) signal and outputs a write enable VDDM 1020 (WEM) signal. Similar to the chip enable level shifter 210, the write enable level shifter 1001 transmits the write enable signal 1010 (WE) from the VDD domain to the output write enable VDDM 1020 (WEM) in the VDDM domain. Further, the write enable level shifter 1001 ties the write enable VDDM 920 (WEM) to a logic low state when the VDD voltage is ramped down below the designed voltage threshold 323. In particular, the write enable level shifter 1001 ties the write enable VDDM 1020 (WEM) to a logic low state when it receives the isolated VDD power signal 117 (ISO_VDD).

Figure 11:
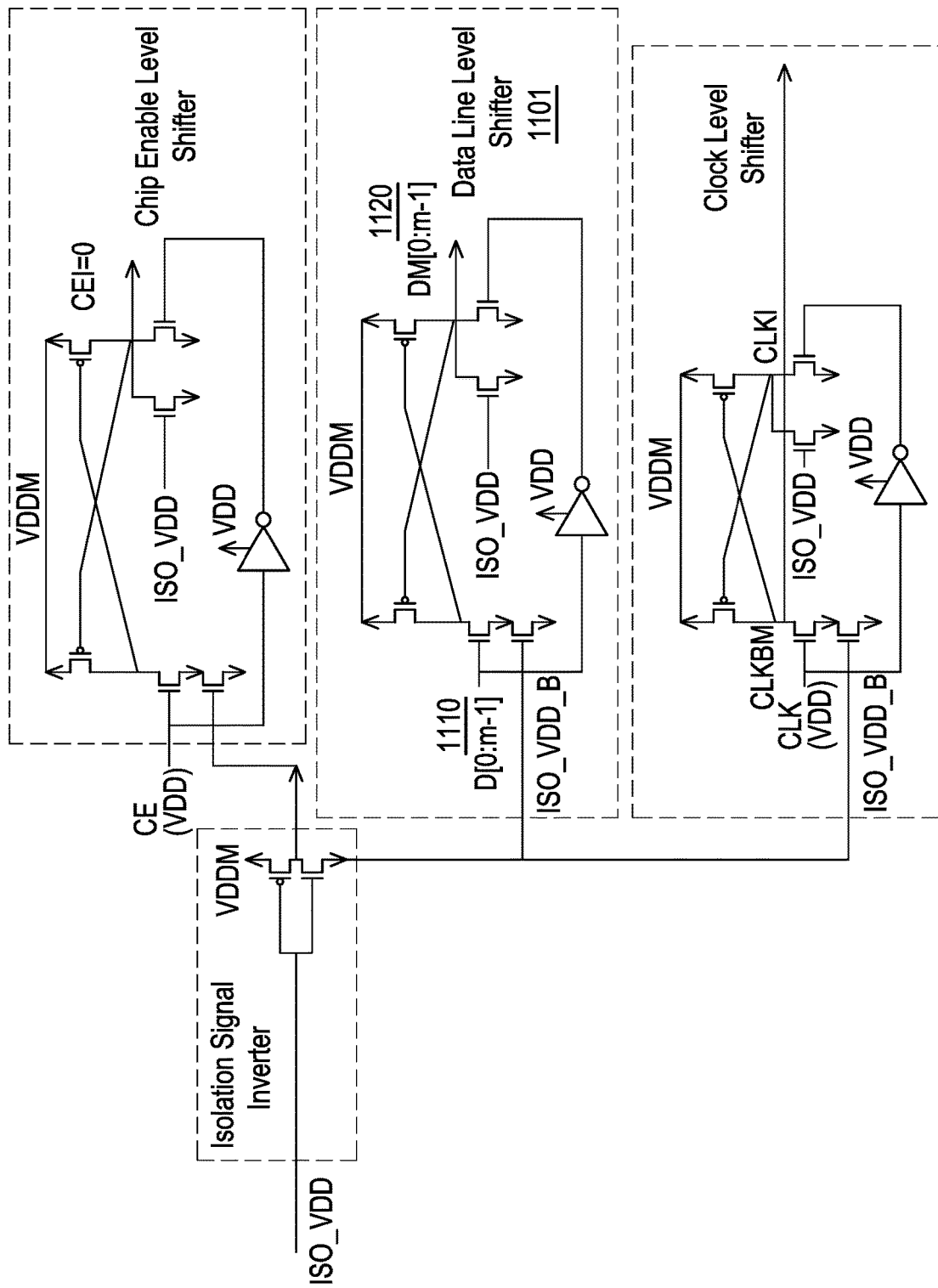
FIG. 11 is a diagram depicting a power management circuit configured for power down of a dual rail power system in memory (e.g. SRAM) with a data line level shifter in accordance with an embodiment.

FIG. 11 is a diagram depicting a power management circuit configured for power down of a dual rail power system in memory (e.g. SRAM) with a data line level shifter in accordance with an embodiment. The example circuitry 1100 shown in FIG. 11 is the same as the example circuitry 400 shown in FIG. 4A, except that the example 1100 shown in FIG. 11 includes an additional data line level shifter 1101. The data line level shifter 1101 may be included along with the clock level shifter 220, the chip enable level shifter 210, the address level shifter 901, and the write enable shifter 1001. The data line level shifter 1101 is identical to the chip enable level shifter 210 except that it receives a data line 1110 (D [0:m−1]) and outputs a data line VDDM 1120 (DM [0:m−1]). Similar to the chip enable level shifter 210, the data line level shifter 1101 transmits the data line 1110 (D [0:m−1]) from the VDD domain to the output data line VDDM 1020 (DM [0:m−1]) in the VDDM domain. Further, the data line level shifter 1101 ties the data line VDDM 1120 (DM [0:m−1]) to a logic low state when the VDD voltage is ramped down below the designed voltage threshold 323. In particular, the data line level shifter 1101 ties the data line VDDM 1120 (DM [0:m−1]) to a logic low state when it receives the isolated VDD power signal 117 (ISO_VDD). In memory configurations with multiple memory array the data line 1110 (D [0:m−1]) may be the data line for a particular memory array for example the data line for the left memory array (D [0:mL−1]) or the right memory array (D [0:mR−1]).

Figure 12:
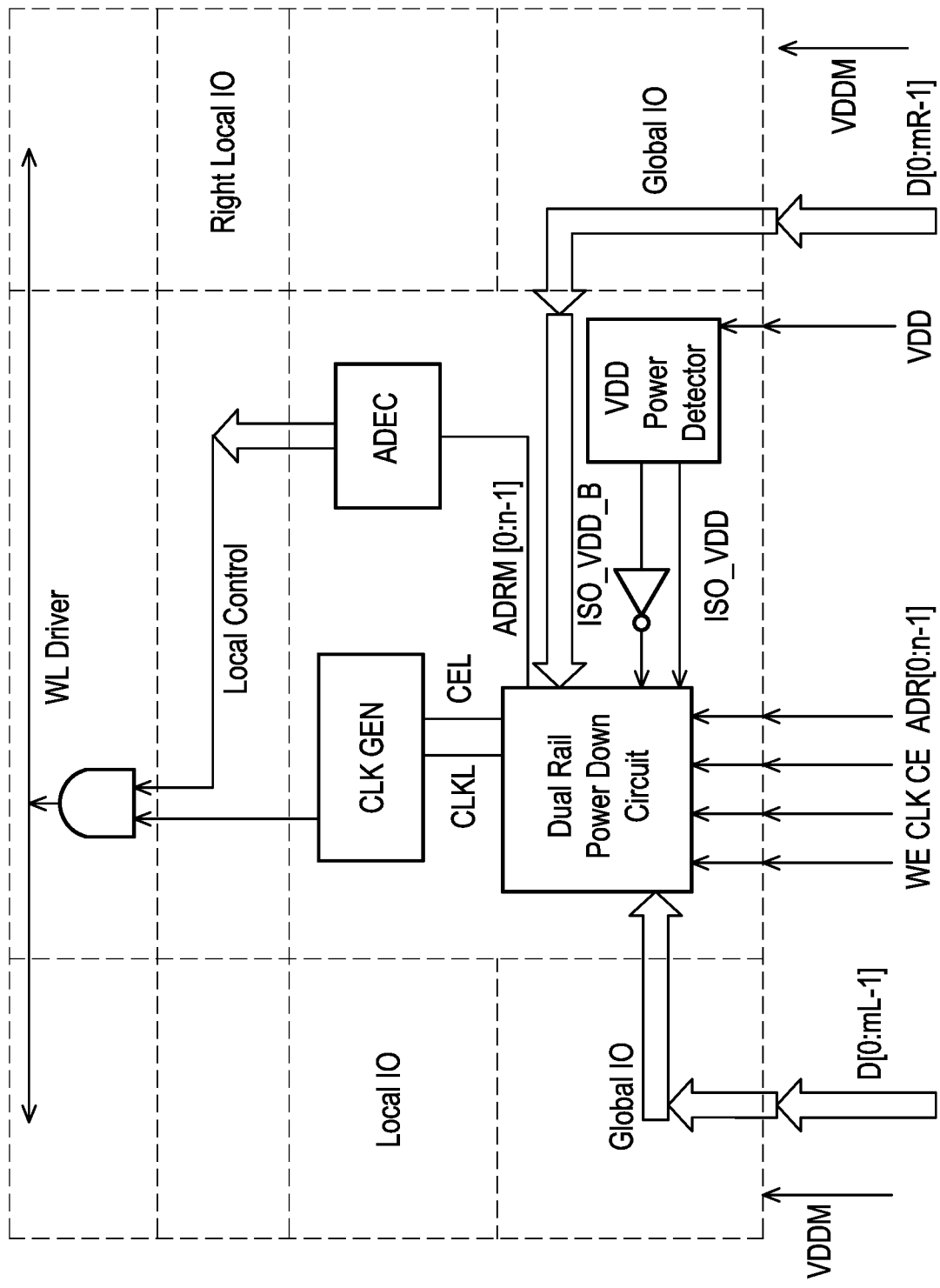
FIG. 12 is a diagram depicting a power management circuit configured for power down of a dual rail power system in memory (e.g. SRAM) in accordance with an embodiment.

FIG. 12 is a diagram depicting a power management circuit configured for power down of a dual rail power system in memory (e.g. SRAM) in accordance with an embodiment. In this embodiment the dual rail power down circuit 101 is configured with connection to the VDD power detector 103 and connections to all inputs (e.g., D [0:mL−1], D [0:mR−1], ADR [0:n−1], WE, CLK, and CE) at the associated level shifter for that input. This embodiment is designed so that all input pins are disabled when the associated level shifter circuit receives the isolated VDD power signal 117. Thus, when the first voltage rail 111 (VDD) is ramped down below the threshold voltage 323, each of the input signals is tied to a logic low state. This power down design is described for the chip enable signal 123 (CE) and clock signal 121 (CLK) in FIG. 4A. This results in a potential reduction in leakage current because the transistors associated with the input signal (e.g., 411, 417, 423, 427) are disabled during power down. Since the transistors associated with the input signals are disabled, any floating voltage at the VDD domain inverter (e.g. 419, 429) cannot toggle the associated transistors to an on state where current will flow. Without this power down design, transistors toggled to an on state during power down will form a path from VDDM 113 to ground 115. This path results in leakage current. In this manner, tying all of input signals to ground during power down reduces leakage current.

In other embodiments the isolated VDD power signal 117 (ISO_VDD) is connected to several level shifters, but not the level shifters for all input signals. For level shifters without a connection to the isolated VDD power signal 117 (ISO_VDD), the transistor associated with that input signal may be toggled to an on operating state during VDD 111 power down. These embodiments may be utilized with reduced area penalty since the level shifter circuits do not include additional transistors for disabling input signals during power down. The additional transistors are not placed into the design because the isolated VDD power signal 117 (ISO_VDD) is not tied to the level shifter to force the associated signal low. Thus resulting in less components and less area penalty. This embodiment balances area penalty with leakage current losses to meet particular design goals. In these embodiments the isolated VDD power signal 117 (ISO_VDD) may be connected to level shifters for the clock signal 121 (CLK) and the chip enable signal 123 (CE), but not for input signals such as the write enable signal (WE). This design disables the clock generator 105 during power down, as described in FIGS. 4A-4B, to reduce power consumption while incurring reduced area penalty due to the lack of additional transistors on the other level shifters (e.g. the write enable level shifter 1001).

Figure 13:
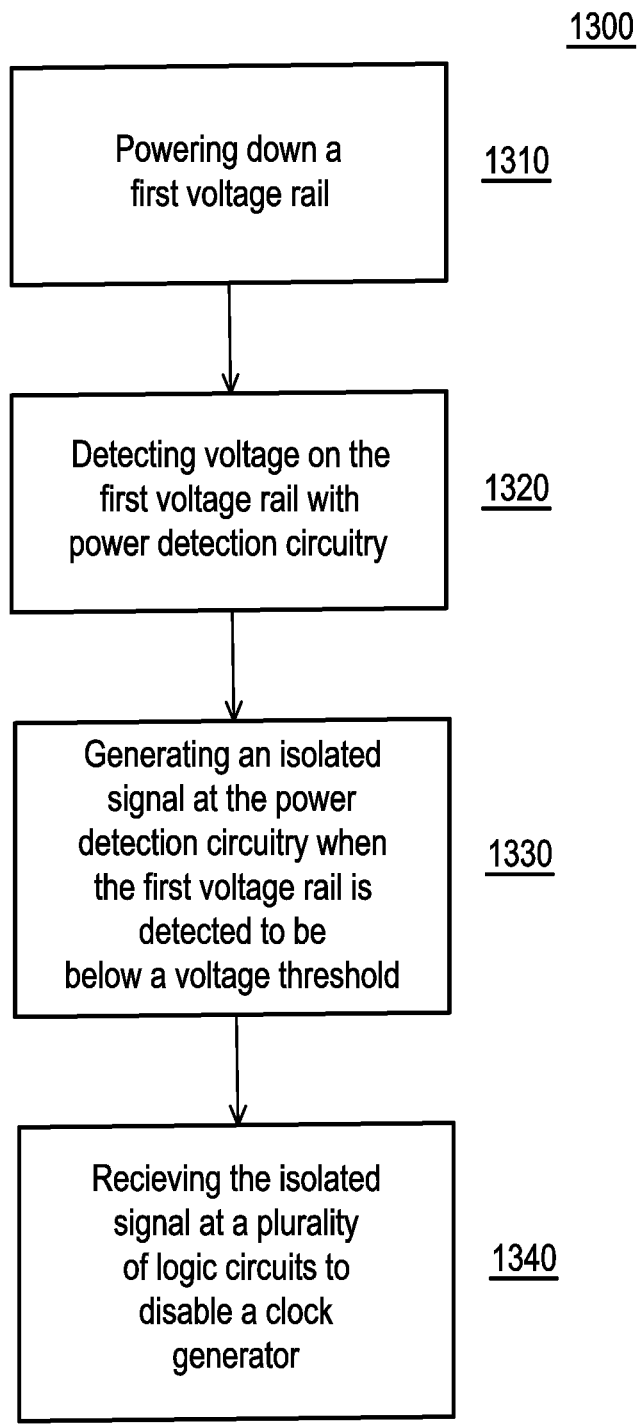
FIG. 13 is a flow diagram of an example method for power down of a dual rail power system in memory (e.g. SRAM) in accordance with an embodiment.

FIG. 13 is a flow diagram of an example method 1300 for power down of a dual rail power system in memory (e.g. SRAM) in accordance with an embodiment. The steps of FIG. 13 are provided with reference to previously described structures for ease of understanding, but it is understood that the steps could be performed using a variety of structures. Specifically, a low power method for preserving power during VDD power down when VDDM remains powered on. This method may be practiced by, for example, circuits displayed in FIGS. 1, 2, 12 in 100, 200, 1200. A VDD power line is powered down 1310, generally through a controlled ramp down. The power on VDD is detected by a detection circuitry 1320 such as the VDD power detector 103 in FIGS. 1,2 3, and 12. An isolated signal is generated at the power detection circuitry when VDD is detected to be below a voltage threshold 1330. The isolated signal may be the isolated VDD power 117 (ISO_VDD) signal in FIGS. 1, 2, 3, 4, 7, 9, 10, 11, 12. The isolated signal is received at various logic circuits to disable a clock generator 1340. The logic circuits may include, for example, level shifters (e.g., a chip enable level shifter, a clock level shifter, a write enable level shifter, an address line level shifter, a data line level shifter), inverters, and latch circuits. The logic circuits may be the logic circuits in FIGS. 1, 2, 3, 4, 7, 9, 10, 11 such as the signal inverter 107, the clock latch circuit 240, the chip enable level shifter 210, the clock level shifter 220, the address level shifter 901, the write enable level shifter 1001, and the data line level shifter 1101. The clock generator may be the clock generator 105 in FIGS. 1, 2, 8, and 12.

According to some embodiments, systems and methods are provided for an integrated dual rail memory (e.g., SRAM) power down scheme. In an example, the circuitry includes a clock generator, a logic voltage rail (VDD), a memory voltage rail (VDDM), and a power detector for VDD. The power detector is configured to generate an isolated power signal when the VDD ramps down below a designated voltage during power down. The isolated power signal is further connected to the clock generator through a series of logic circuitry such that the clock generator is disabled during VDD power down. In this manner the component utilizing the power down scheme may preserve power by preventing the clock generator from triggering additional read/write cycles. The circuitry may, for example, include a level shifter circuit for the clock signal and chip enable signal. The isolated power signal may be connected to the level shifter of the chip enable signal such that the chip enable signal is tied to a logic low state during VDD ramp down. Similarly, the clock signal may be tied to a designated logic state during VDD ramp down through additional connection of the isolated power signal to the clock level shifter. In one example, the clock signal is tied to a logic high state such that the clock generator may be more easily enabled by allowing the chip enable to be toggled during VDD ramp up. In another example, the clock signal is tied to a logic low state such that the clock generator is prevented from triggering a read/write cycle even if the chip enable signal were toggled to a logic high state. In some embodiments, latch circuitry is configured between input signal level shifters (e.g. chip enable signal, clock, address, write enable) such that the latch is only transmitting when the internal clock of the clock generator is in a logic low state. The latch circuit for the chip enable may be forced to logic 0 through a clock input signal generated at the clock level shifter to ensure that pull down NMOS transistors in the clock generate are not toggled. In this example the latch circuit for the chip enable is configured with the clock input signal as an input instead of the internal clock signal.

According to some embodiments, systems and methods are provided for power down memory array with multiple power rails. Specifically, powering down VDD of an integrated dual rail systems while VDDM remains powered on within SRAM. This may occur when VDD is ramped down immediately prior to VDDM or where VDDM remains powered on for a period of time after VDD has been powered down. In this example embodiment a power detection circuitry is connected to the VDD power line such that an isolated power signal will be generated when VDD is ramps down below a designed voltage threshold 323. The isolated signal is connected to multiple logic circuits to internal signals to preserve dynamic power which may otherwise be wasted when transistors are triggered by floating voltages. In particular the internal clock of the clock generator may be disabled to prevent additional read/write cycles within the SRAM. In certain embodiments the internal clock signal is disabled by disabling a chip enable signal at a level shifter for the chip enable. In other embodiments, the internal clock signal is disabled by forcing both a clock input signal and the chip enable signal to a logic low state. In additional embodiments, the isolated power signal may be connected to the address pins, data pins, or write enable pins. In certain embodiments the isolated power signal is tied to the level shifter for all input pins such that all of the transistors for the associated level shifters can be tied to a logic low state. In these embodiments the leakage current is reduced as transistors within the level shifters are not toggled by floating voltage at the VDD inverter of the level shifters.

In an additional embodiment, a power management circuit is described for powering down dual rail memory using means for detecting power on the first power rail (VDD) and communicating the VDD power to various level shifters to disable associated signals. Specifically, the power down circuitry is configured to disable the clock generator when the VDD power rail falls below a threshold voltage. This may be done through a power detection circuitry at the VDD rail which generates a power down signal. In this manner the VDD rail may be powered down while power is maintained to the power rail for memory cells. The power signal may be configured to communicate the power down of VDD through a power down signal connected to level shifters at various input pins. In particular, the chip enable signal for the clock generator may be tied low when the level shifter receives the power down signal, generally through a series of logic circuitry. In some embodiments latches are configured between the respective level shifters and the clock generator. In these embodiments the latch connected to the chip enable level shifter will be configured to receive that signal from the chip enable shifter and a clock input signal from the clock level shifter. Further, the latch for the clock level shifter may be configured to produce a latch signal that is tied to either a logic low state or a logic high state during VDD ramp down. Depending on design criteria the clock latch signal may be tied to a logic high state to allow the clock enable to be toggled based on the signal from the chip enable latch. In other embodiments, the clock latch signal may be tied to a logic low state to prevent the clock enable from accidentally being toggled based on the chip enable latch. In further embodiments, different circuitry could be configured to communicate VDD power down to all input pin level shifters. In these embodiments transistors within the level shifters associated with the input pins are disabled during VDD power down to reduce leakage current.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A dual rail power down scheme for a memory circuit, comprising:
   a first voltage rail,
   a power detector associated with the first voltage rail configured to generate an isolated power signal when the first voltage rail powers down below a threshold voltage, and
   logic circuitry configured to receive the isolated power signal and output an enabling signal to a clock generator;
      wherein the enabling signal disables the clock generator when logic circuit receives the isolated power signal.

2. The dual rail power down scheme of claim 1, wherein the logic circuitry comprises:
   a plurality of latch circuits, and
   a plurality of level shifter circuits, configured to shift the voltage of a plurality of logic signals between the voltage on the first voltage rail and the voltage on a second voltage rail.

3. The dual rail power down scheme of claim 2, wherein the level shifter circuits comprise a level shifter for each input pin associated with the memory circuit; wherein each level shifter output is tied low when the level shifter circuitry receives the isolated power signal.

4. The dual rail power down scheme of claim 2, wherein the level shifter circuits comprise:
   a level shifter for a clock signal, and
   a level shifter for the enabling signal.

5. The dual rail power down circuit of claim 4, wherein the output of the level shifter for the clock signal is tied to ground when the level shifter for the clock signal receives the isolated power signal.

6. The dual rail power down circuit of claim 4, wherein the output of the level shifter for the clock signal and the output of the level shifter for the enabling circuit propagate to an enabling latch circuit.

7. The dual rail power down circuit of claim 6, wherein the output of the enabling latch circuit is received by the clock generator and toggles the clock generator.

8. The dual rail power down circuit of claim 6, further comprising a clock latch which is configured to receive the output of the clock generator and the inverse output of the level shifter for the clock signal.

9. The dual rail power down circuit of claim 8, wherein the clock generator is configured to receive both the output of the enabling latch circuit and the output of the clock latch circuit;
   wherein the clock generator is disabled by either the output of the enabling latch circuit or the output of the clock latch circuit during power down of the first power rail.

10. A method of powering down power rails of a memory circuit, comprising:
    powering down a first voltage rail while a second voltage rail remains powered on, wherein the method for powering down the first voltage rail comprises:
       detecting the voltage on the first voltage rail with power detection circuitry;
       generating an isolated signal when the first voltage rail is detected to be below a voltage threshold;
       receiving the isolated signal at a plurality of logic circuits to disable the clock generator.

11. The method of claim 10, wherein the logic circuits comprise level shifter circuits for a plurality of input pins.

12. The method of claim 11, wherein the input pins comprise a plurality of address pins, a plurality of data pins, a clock pin, and a write enable pin.

13. The method of claim 11, wherein the level shifter circuits outputs are forced to a logic low state when each of the respective level shifters receives the isolated signal.

14. The method of claim 11, further comprising a plurality of latch circuits which receive the output of the level shifters and generate a propagated chip enable signal for the clock generator.

15. The method of claim 11, wherein the level shifter circuits are configured for all of the input pins such that all input pins are disabled when the level shifter circuits receive the isolated signal.

16. The method of claim 10, wherein clock generator is toggled based on the propagated chip enable signal.

17. The method of claim 10, wherein the clock generator is disabled unless both the propagated chip enable signal and a clock VDDM signal are enabled.

18. The method of claim 17, wherein the propagated chip enable signal and the clock VDDM signal are forced low when the isolated signal is received by the logic circuitry.

19. A power down circuit for dual rail memory, comprising:
    means for detecting power on a first power rail, a plurality of level shifters configured to shift logic signals between the voltage of the first power rail and the voltage of a second power rail, and a logic circuit configured to disable a clock generator when the first power rail voltage is below a threshold voltage.

20. The power down circuit of claim 19, wherein the second power rail is configured to maintain power to memory cells when the first power rail is powered down.

* * * * *